United States Patent [19]
Oshima et al.

[11] Patent Number: 5,521,437
[45] Date of Patent: May 28, 1996

[54] SEMICONDUCTOR POWER MODULE HAVING AN IMPROVED COMPOSITE BOARD AND METHOD OF FABRICATING THE SAME

[75] Inventors: Seiichi Oshima; Tatsuo Oota, both of Fukuoka, Japan

[73] Assignee: Mitsubishi Denki Kabushiki Kaisha, Tokyo, Japan

[21] Appl. No.: 270,372

[22] Filed: Jul. 5, 1994

[30] Foreign Application Priority Data

Jul. 5, 1993 [JP] Japan ........................... 5-165471

[51] Int. Cl.⁶ .......................... H01L 23/16; H01L 27/02
[52] U.S. Cl. .......................... 257/701; 257/723; 257/687; 257/706
[58] Field of Search .............................. 257/607, 701, 257/702, 706, 707, 723, 724, 500

[56] References Cited

U.S. PATENT DOCUMENTS

| | | | |
|---|---|---|---|
| 4,639,759 | 1/1987 | Neidig et al. | 257/687 |
| 4,916,502 | 4/1990 | Oshima | 257/687 |
| 4,965,710 | 10/1990 | Pelly et al. | 363/56 |
| 5,006,920 | 4/1991 | Schafer et al. | 257/706 |
| 5,077,595 | 12/1991 | Fukunaga | 257/723 |
| 5,291,065 | 3/1994 | Arai et al. | 257/691 |
| 5,347,158 | 9/1994 | Matsuda et al. | 257/706 |

FOREIGN PATENT DOCUMENTS

| | | |
|---|---|---|
| 0463589 | 2/1992 | European Pat. Off. . |
| 62-5696 | 1/1987 | Japan . |
| 62-176194 | 8/1987 | Japan . |
| 3-75549 | 7/1991 | Japan . |
| 3-75551 | 7/1991 | Japan . |
| 3-75550 | 7/1991 | Japan . |
| 3-227045 | 10/1991 | Japan . |
| 4-82595 | 3/1992 | Japan . |

OTHER PUBLICATIONS

1989 IEEE Industry Applications Society Annual Meeting, Part II, San Diego, California, Oct. 1–5, 1989, pp. 1356–1362, G. Majumdar et al.: "A New Series of Smart Controllers".
Patent Abstracts of Japan vol. 16 No. 521 (E-1285), 27 Oct. 1992 & JP-A-04-196345 (Nissan Motor) *abstract*.

*Primary Examiner*—Robert P. Limanek
*Assistant Examiner*—David B. Hardy
*Attorney, Agent, or Firm*—Oblon, Spivak, McClelland, Maier & Neustadt

[57] ABSTRACT

An insulating metallic board 160 mounting IGBTs which control an electrical power and other circuit elements and an insulating board 170 mounting semiconductor elements which control the IGBTs and the other circuit elements are arranged adjacent to or closely parallel to each other, and combined by a frame 180 into one integral circuit board to define a composite board 150. Wiring patterns 161 and 171 on which the respective circuit elements are to be disposed are formed on major surfaces of the same side. Since the composite board 150 which includes the two different types of circuit boards can be treated simply as one board, it is possible to mount the circuit elements onto the two different types of boards at the same time in one fabrication step. Thus, the number of fabrication steps and a manufacturing cost are reduced.

56 Claims, 15 Drawing Sheets

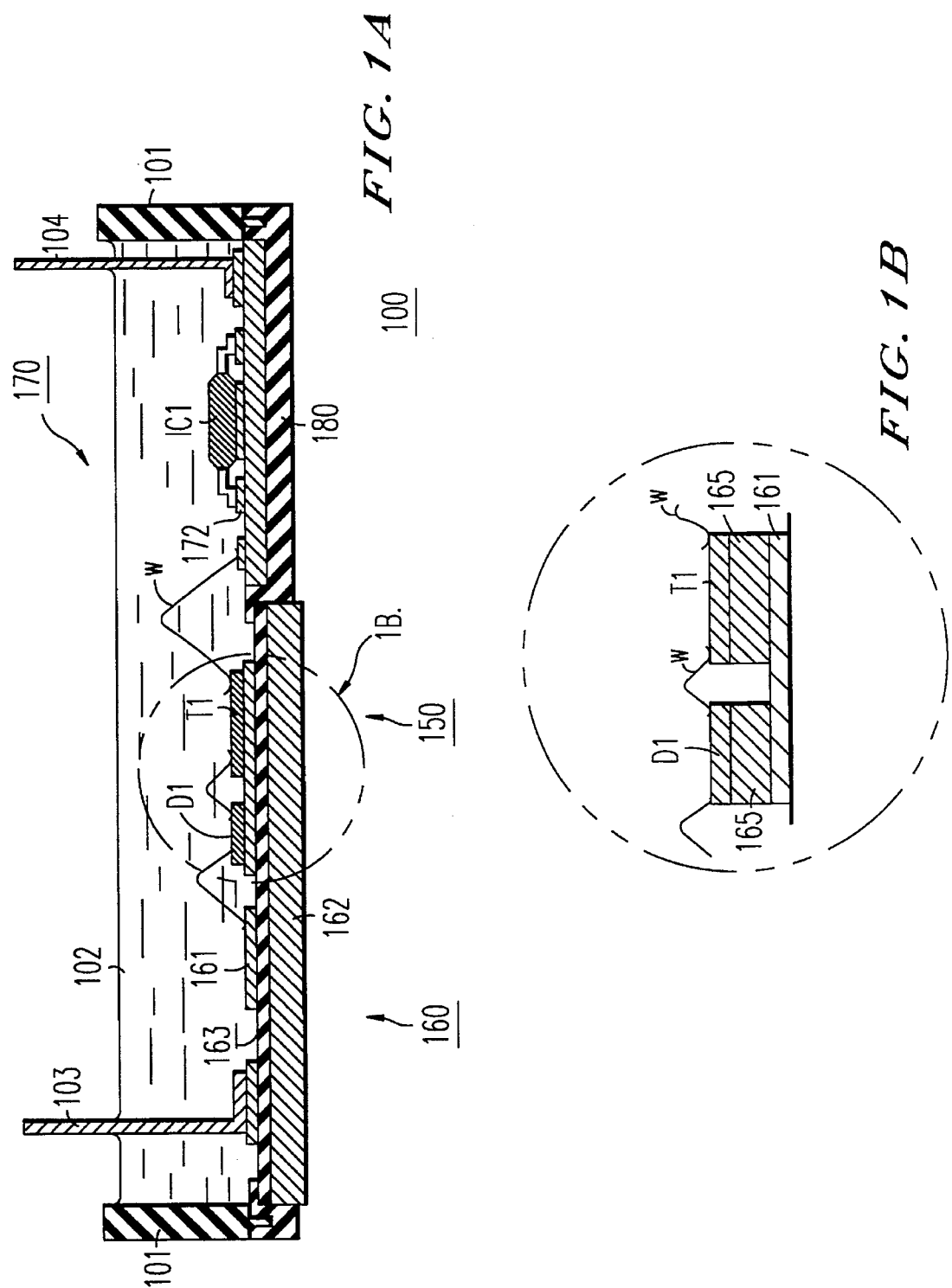

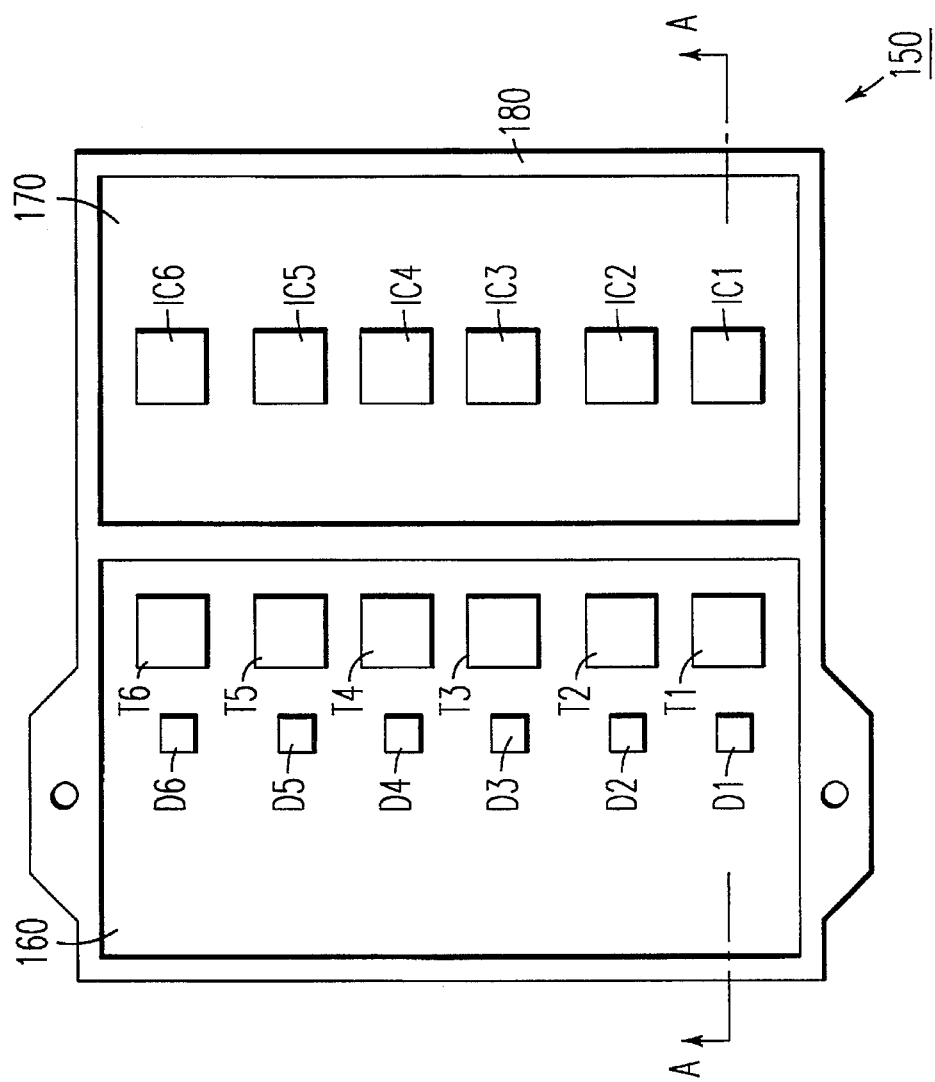

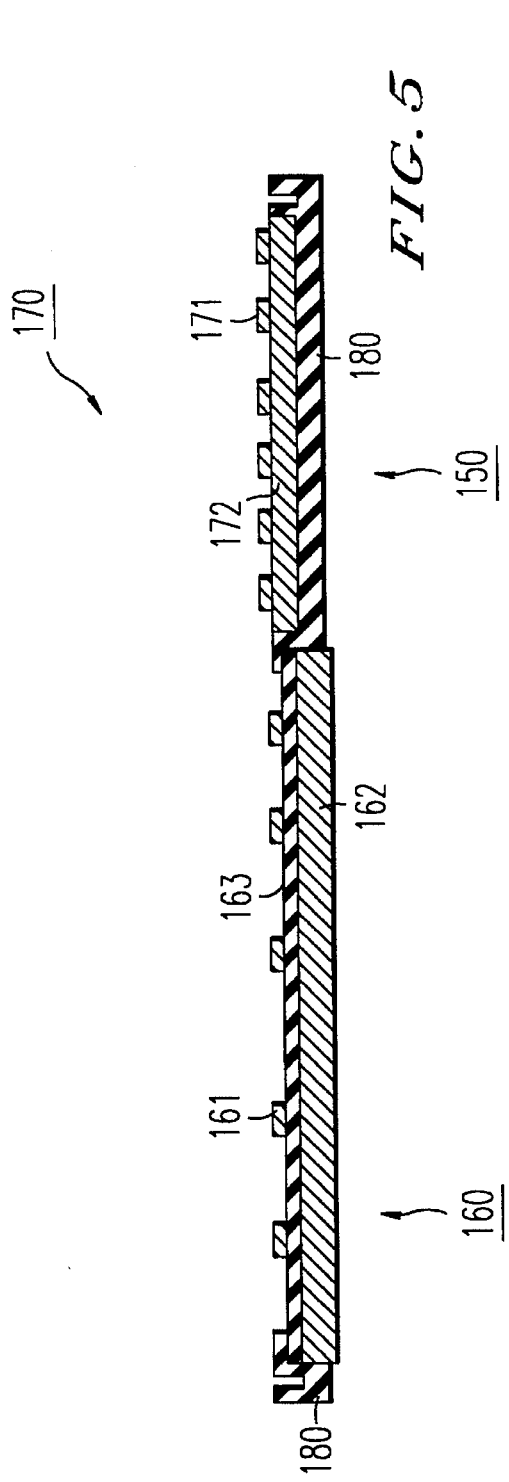
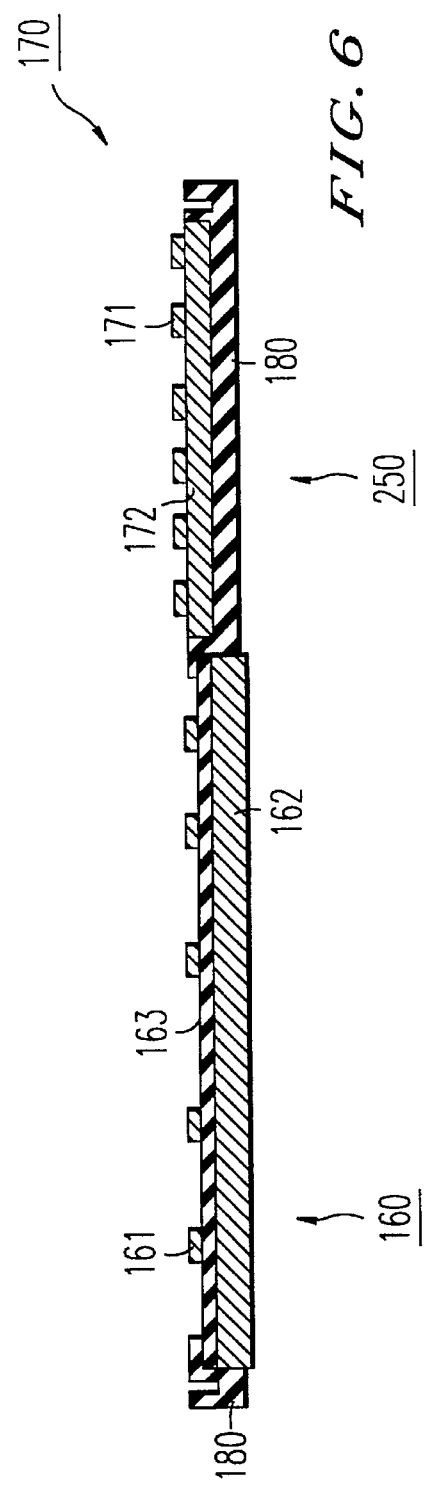

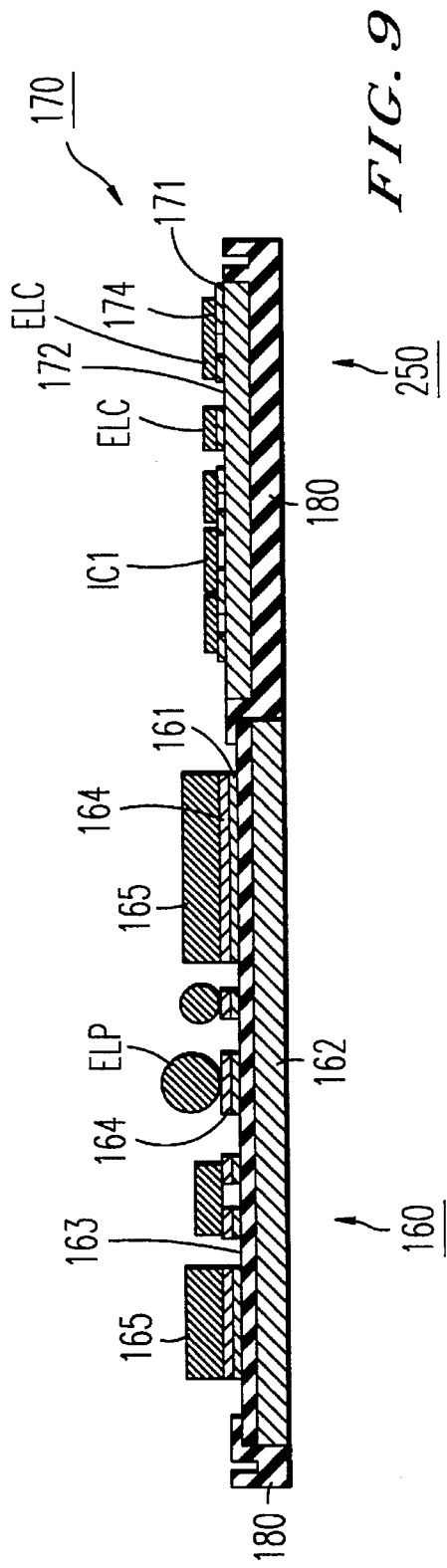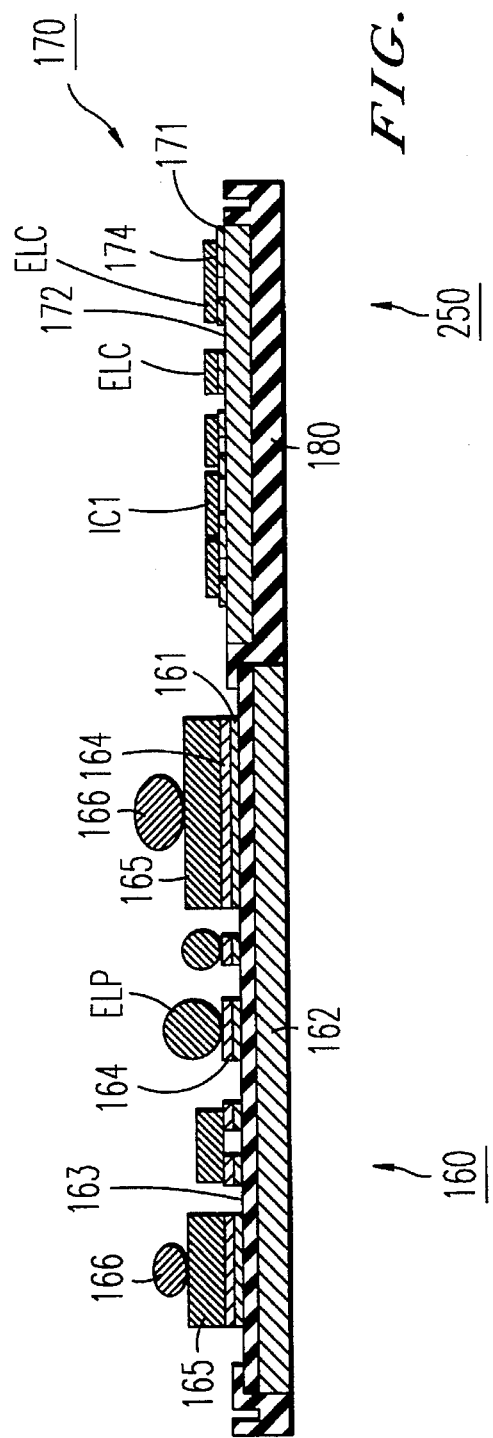

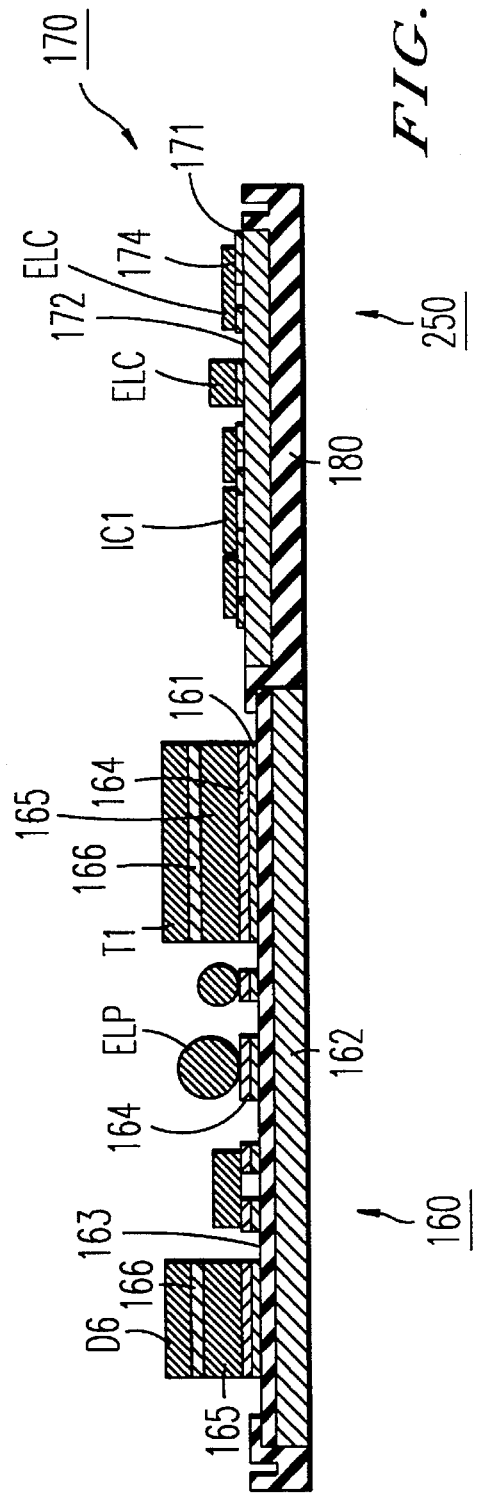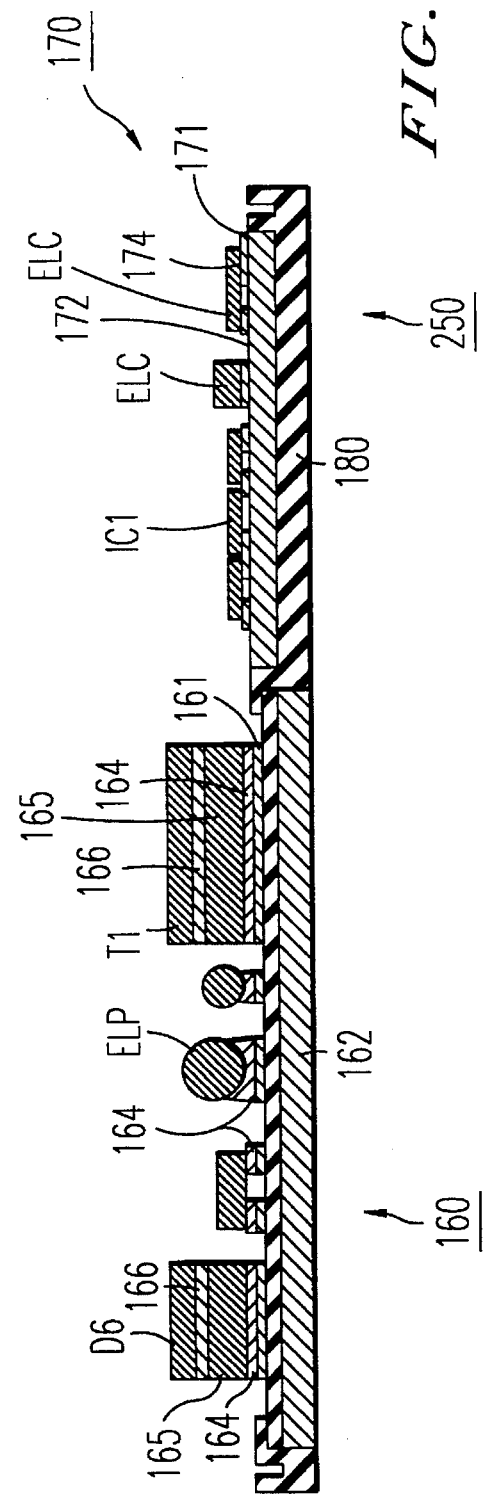

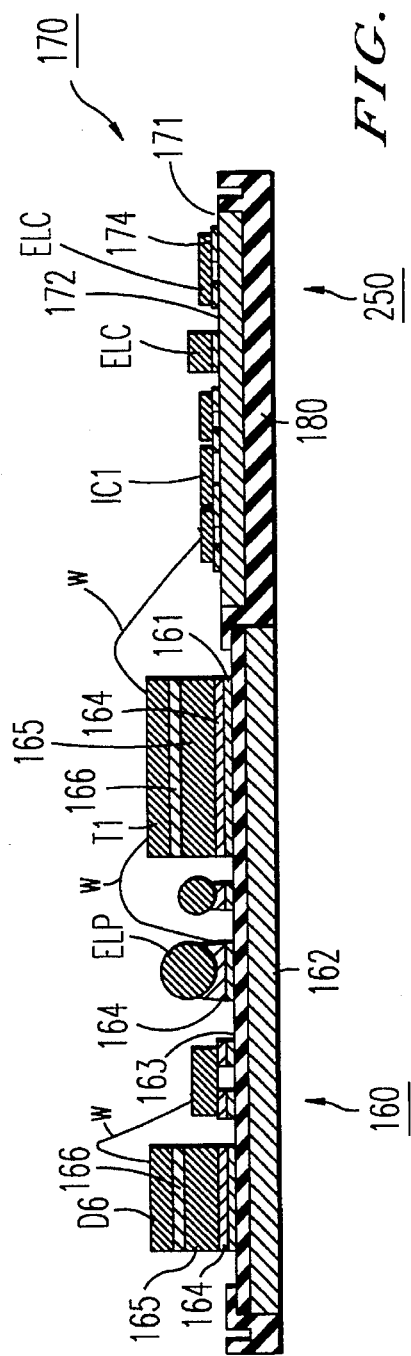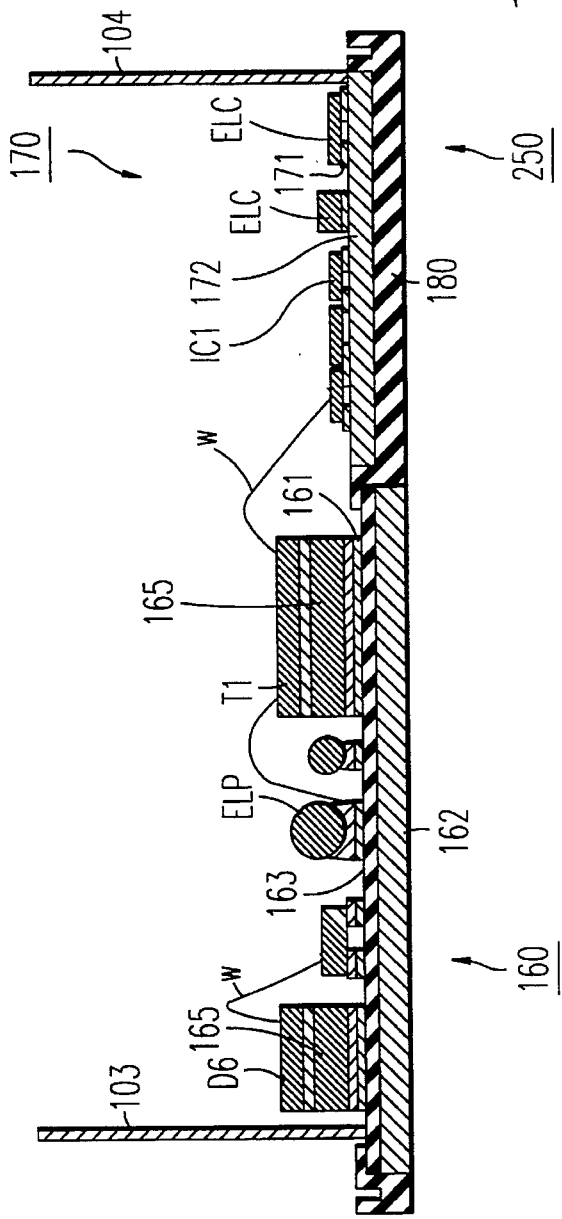

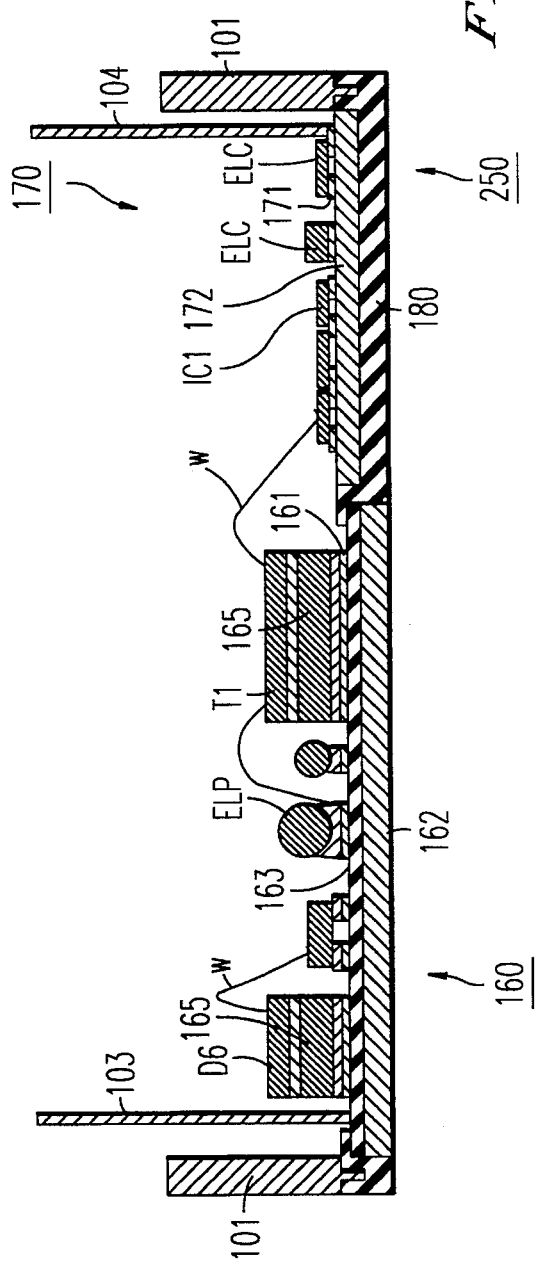
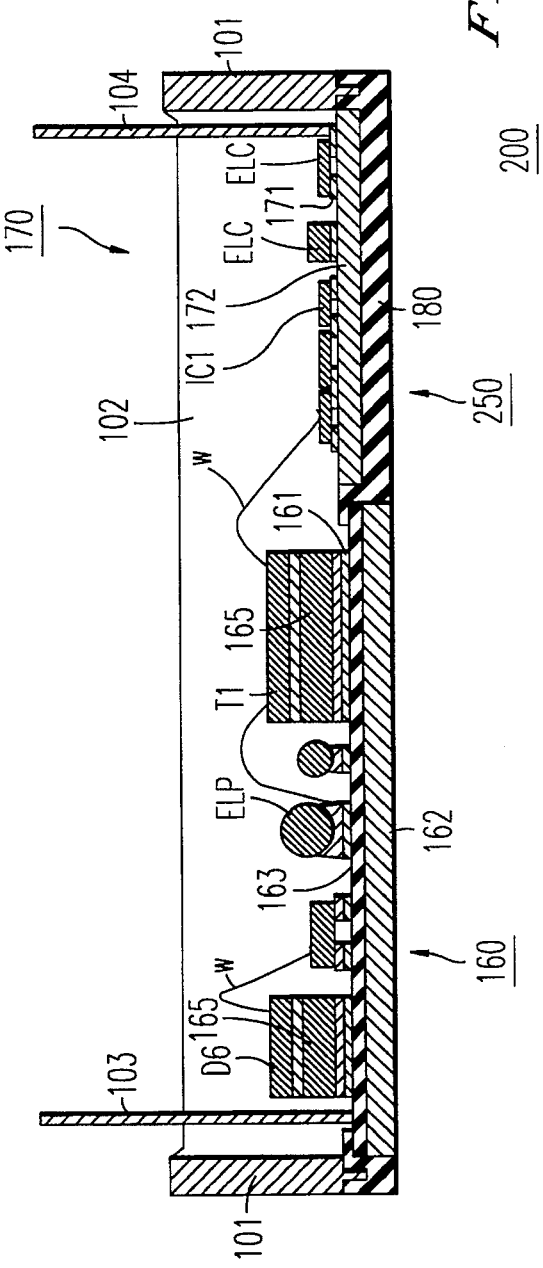
FIG. 15
FIG. 16

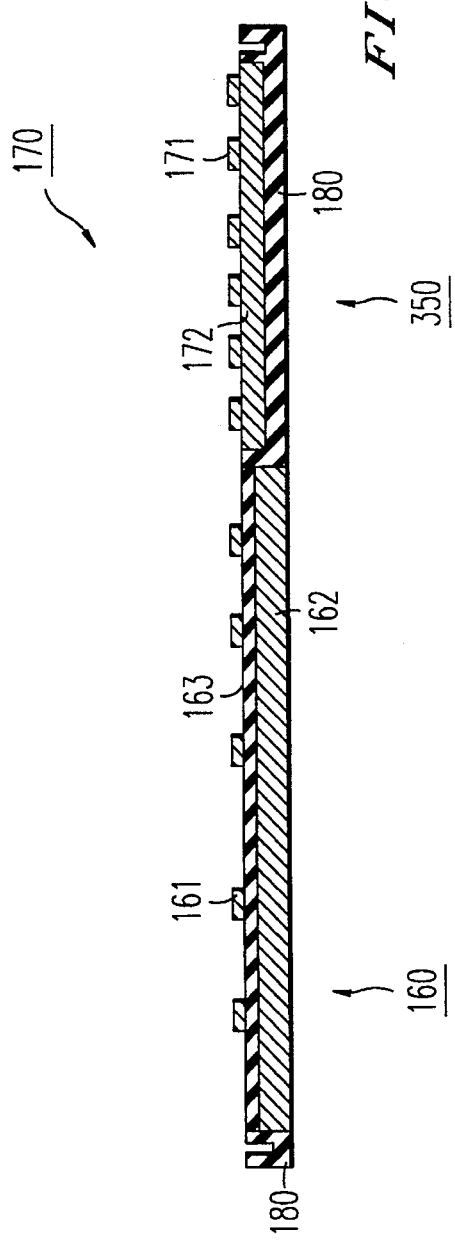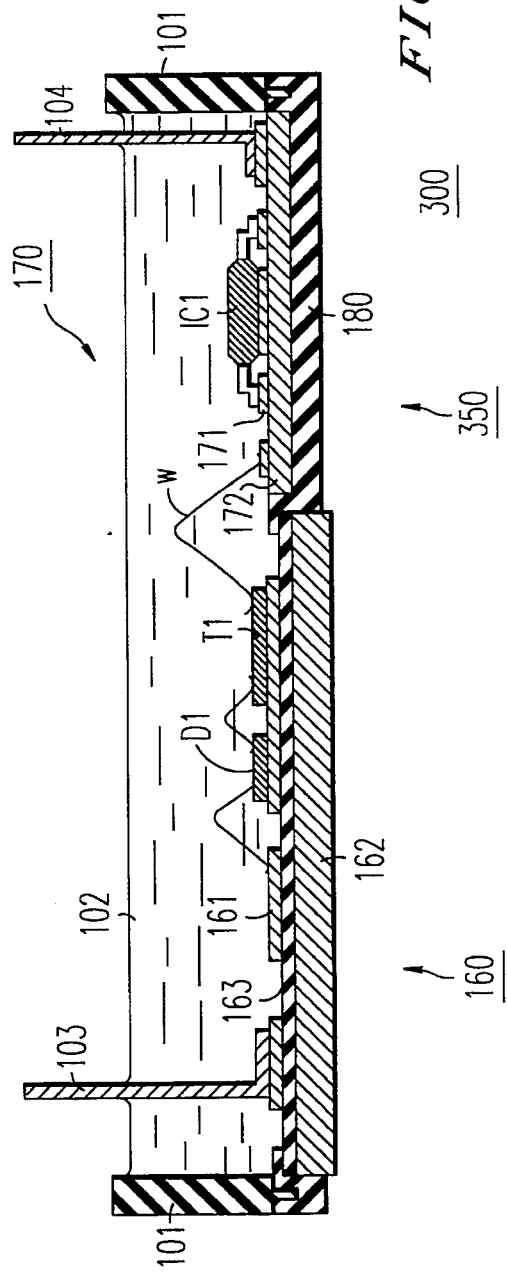

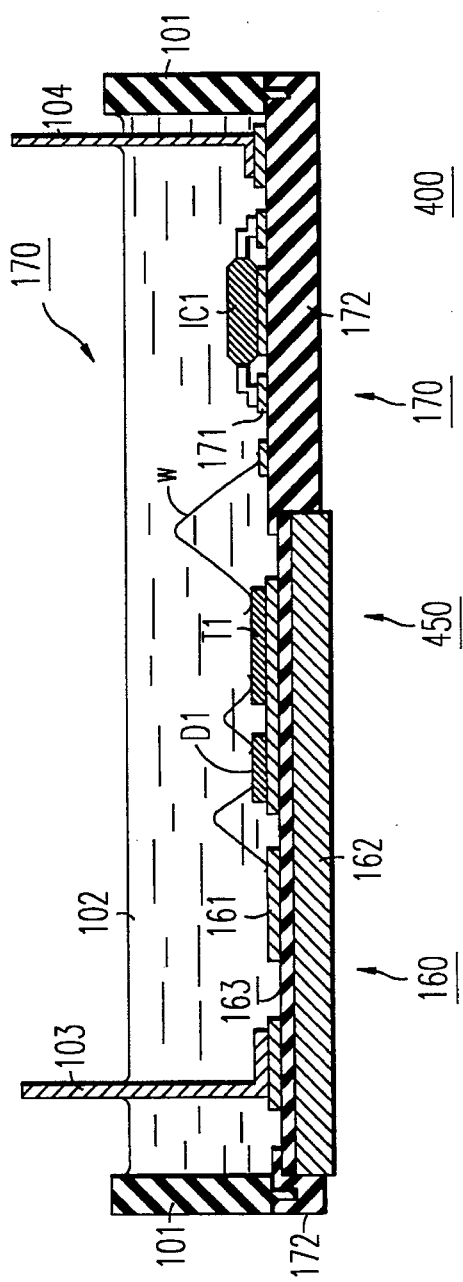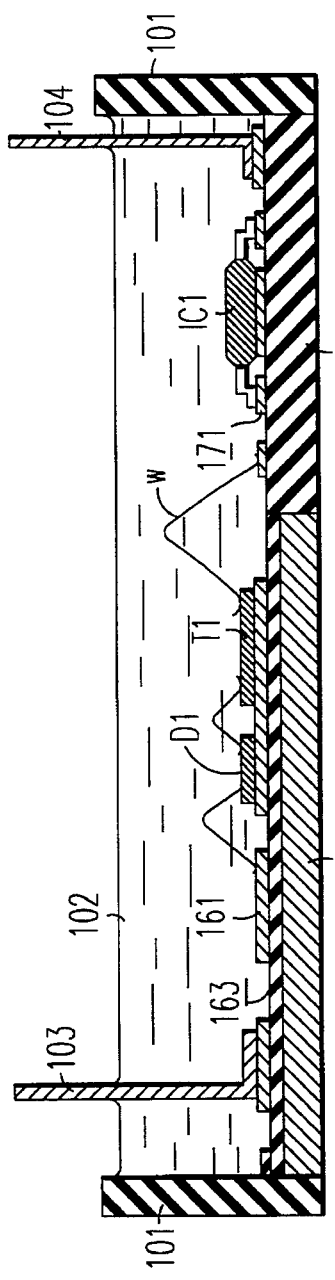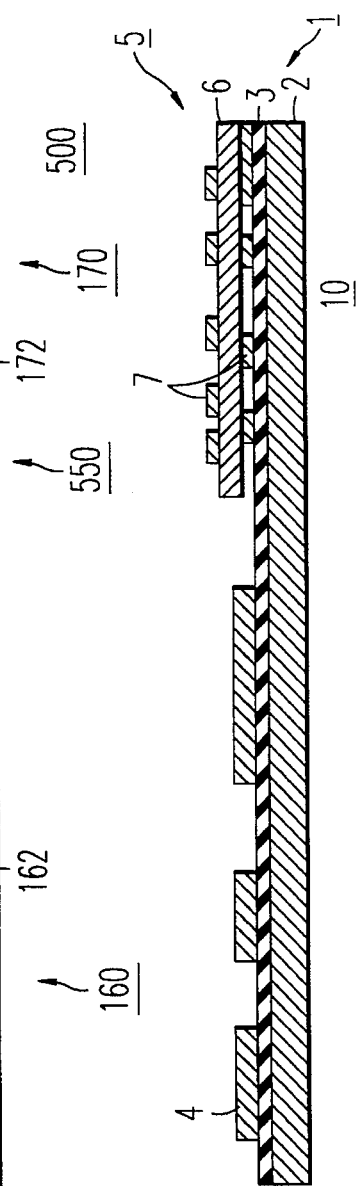

SEMICONDUCTOR POWER MODULE HAVING AN IMPROVED COMPOSITE BOARD AND METHOD OF FABRICATING THE SAME

BACKGROUND OF THE INVENTION

1. Field of the Invention

The present invention relates to a semiconductor power module, a composite board used in semiconductor power module, and a method of fabricating a semiconductor power module.

2. Description of the Background Art

A semiconductor power module is formed by incorporating a main circuit, which includes a power control semiconductor element which controls a power, and a control circuit, which includes a control element which transmits and receives a signal to and from the main circuit to control operations of the main circuit, in one device. A semiconductor power module is used primarily as an invertor for controlling operations of a motor and etc.

FIG. 23 is a front cross-sectional view of a circuit board 10 which is used in a conventional semiconductor power module. In a semiconductor power module, a heat loss which is created in a main circuit should be able to effectively discharge outside the module. To attain this, a main circuit board 1 on which a main circuit is seated is formed by an insulating metallic board in the conventional semiconductor power module. That is, the main circuit board I comprises an insulating layer 3, which is disposed on one major surface of a metallic base plate 2 which has an excellent conductivity, and a main circuit wiring pattern 4 which is disposed on the insulating layer 3. The main circuit wiring pattern is connected to a power control semiconductor element which forms the main circuit. Whenever a heat loss is created in the power control semiconductor element which passes a large current and the main circuit wiring pattern, the heat loss is transferred to the metallic base plate 2, and then radiated to an external heat dissipation mechanism which is connected to the metallic base plate 2.

The insulating layer 3 includes an area in which the main circuit wiring pattern 4 is not formed. Instead, a control circuit board 5 is fixed on the insulating layer 3 by an adhesive agent in this area. The control circuit board 5 includes an insulating circuit board body 6 which is shaped in a plate-like configuration and a control circuit wiring pattern 7 which is disposed on the both major surfaces of the insulating circuit board body 6. The control circuit wiring pattern 7 is connected to a control element which forms a control circuit which processes a voltage signal. Only very weak current is allowed into the control circuit. For this reason, the control circuit board 5 includes no special heat dissipation structure.

Being formed using such a circuit board 10 as above which includes a stacked structure in which the control circuit board 5 is superimposed on the main circuit board 1 which includes the metallic base plate 2, the conventional semiconductor power module has the following problems.

First, fabrication of the semiconductor power module is not simple. That is, mounting of the power control element on the main circuit board 1 and mounting of the control element on the control circuit board 5 are performed separately in different fabrication steps, and the two boards are thereafter stacked one above the other into one stacked structure. There is a considerably large difference in height between the major surfaces of the two boards, and therefore, it is difficult to mount the elements on the two respective boards at the same time in one fabrication step after stacking the two boards one atop the other into one stacked structure in advance. For this reason, fabrication of the semiconductor power module needs many fabrication steps, which in turn increases a manufacturing cost.

Second, to dispose the expensive main circuit board 1 also under the control circuit board 5 which does not include a heat dissipation mechanism is not economical.

SUMMARY OF THE INVENTION

A first aspect of the present invention is directed to a semiconductor power module, comprising: (a) a composite board which includes: (a-1) an insulating metallic board which includes a metallic plate, a main circuit wiring pattern being disposed on one major surface of the insulating metallic board through an insulating layer; and (a-2) an insulating board which includes a plate-like shaped insulating member, a control circuit wiring pattern being disposed on one major surface of the insulating board, the insulating board being disposed adjacent to or closely parallel to the insulating metallic board in such a manner that the major surface of the insulating board seating the control circuit wiring pattern is flush with the major surface of the insulating metallic board seating the main circuit wiring pattern; a major surface of the metallic plate being exposed in a bottom surface of the composite board which is on the opposite side to the major surfaces seating the main and the control circuit wiring patterns, (b) a power control semiconductor element disposed on the main circuit wiring pattern to control an electrical power; (c) a control element disposed on the control circuit wiring pattern to control the power control semiconductor element; (d) a cylindrical case for receiving at its one end an peripheral portion of the composite board so as to contain the power control semiconductor element and the control element inside; and (e) a sealing resin injected into the case to seal the power control semiconductor element and the control element.

Preferably, the power control semiconductor element includes (b-1) an insulated gate bipolar transistor, and the control element transmitting a control signal to a gate electrode of the insulated gate bipolar transistor.

Further, the main circuit pattern includes a high potential side power source pattern, a low potential side power source pattern and an output pattern, and the insulated gate bipolar transistor includes first and second insulated gate bipolar transistor means, the first insulated gate bipolar transistor means being disposed between the high potential side power source pattern and the output pattern, the second insulated gate bipolar transistor means being disposed between the output pattern and the low potential side power source pattern.

Preferably, the output pattern includes a plurality of output wiring patterns, the first insulated gate bipolar transistor means includes a plurality of first insulated gate bipolar transistor elements which are each disposed between the high potential side power source pattern and each one of the output wiring patterns, and the second insulated gate bipolar transistor means includes a plurality of second insulated gate bipolar transistor elements which are each disposed between each one of the output wiring patterns and the low potential side power source pattern.

Preferably, the metallic plate is substantially made of aluminum.

Preferably, the insulating layer is substantially made of an epoxy resin.

Preferably, the insulating member is substantially made of a fiber reinforced epoxy resin.

Preferably, a heat sink member having an excellent electrical conductivity is disposed between the insulated gate bipolar transistor and the main circuit wiring pattern.

Preferably, the power control semiconductor element further includes (b-2) a fly wheel diode which is connected in parallel to the insulated gate bipolar transistor.

Preferably, a fly wheel diode is connected to the main circuit wiring pattern through the heat sink member which has an excellent electrical conductivity.

According to a second aspect of the present invention, in the semiconductor power module of the first aspect of the present invention, the composite board further includes (a-3) a frame member for combining the insulating metallic board and the insulating board which are fit thereinto into one integral board.

Preferably in the second aspect of the present invention, the frame member has a first and a second major surfaces and a first and a second openings, the first opening penetrating the frame member from the first major surface to the second major surface of the frame member, the second opening being opened in the first major surface but closed in the second major surface of the frame member, the insulating metallic board being fit into the first opening in such a manner that the main circuit wiring pattern is on the first major surface side, the insulating board being fit into the second opening in such a manner that the control circuit wiring pattern is on the first major surface side.

Preferably in the second aspect of the present invention, the frame member has a radially extending protrusion which has a through hole.

Preferably in the second aspect of the present invention, a ridge is formed along the periphery of the case at one end of the case, and a groove is formed in the periphery of the frame member for engagement with the ridge.

Preferably in the second aspect of the present invention, the insulating metallic board and the insulating board are both fixed to the frame member by an adhesive agent.

Preferably in the second aspect of the present invention, the adhesive agent is substantially made of a heat-resistant resin.

Preferably in the second aspect of the present invention, the resin is polyphenylene sulfide.

Preferably in the second aspect of the present invention, the first opening includes an inwardly extending protrusion at one end of the first opening so as to prevent the insulating metallic board which is inserted into the first opening from sliding toward the first major surface side from its inserted position.

According to a third aspect of the present invention, in the semiconductor power module of the first aspect of the present invention, either one of the insulating metallic board and the insulating board of the composite board includes an opening to receive the other for engagement.

Preferably in the third aspect of the present invention, the insulating board of the composite board includes an opening which is opened penetrating from one major surface to the other major surface of the insulating board, and the insulating metallic board is fit in the opening of the insulating board.

Preferably in the third aspect of the present invention, insulating board includes a radially extending protrusion which has a through hole.

Preferably in the third aspect of the present invention, a ridge is formed along the periphery of the case at one end of the case, and a groove is formed in the periphery of the frame member for engagement with the ridge.

Preferably in the third aspect of the present invention, the opening includes an inwardly extending protrusion at one end of the opening so as to prevent the insulating metallic board which is inserted into the opening from sliding toward the main circuit wiring pattern from its inserted position.

According to a fourth aspect of the present invention, the semiconductor power module of the first aspect of the present invention does not comprise a member which extends beyond the major surface of the metallic plate which is exposed in the bottom surface of the composite board.

According to a fifth aspect of the present invention, in the semiconductor power module of the first aspect of the present invention, the major surface of the metallic plate which is exposed in the bottom surface of the composite board and other regions of the bottom surface of the composite board are adjusted to be flush with each other.

Preferably in the fifth aspect of the present invention, the major surface of the metallic plate which is exposed in the bottom surface of the composite board extends beyond other regions of the bottom surface of the composite board.

According to a sixth aspect of the present invention, in the semiconductor power module of the first aspect of the present invention, the major surface seating the main circuit wiring pattern and the major surface seating the control circuit wiring pattern are adjusted to be flush with each other in the composite board.

According to a seventh aspect of the present invention, in the semiconductor power module of the first aspect of the present invention, the insulating metallic board and the insulating board of the composite board are disposed adjacent each other and bonded to each other by an adhesive agent where they directly abut.

According to an eighth aspect of the present invention, in the semiconductor power module of the first aspect of the present invention, the insulating metallic board, the insulating board and the case are fixed to each other by an adhesion 25 force of the sealing resin.

A ninth aspect of the present invention is directed to a composite board, comprising: (a) an insulating metallic board which includes a metallic plate, a main circuit wiring pattern being disposed on one major surface of the insulating metallic board through an insulating layer; and (b) an insulating board which includes a plate-like shaped insulating member, a sub circuit wiring pattern being disposed on one major surface of the insulating board, the insulating board being disposed adjacent to or closely parallel to the insulating metallic board in such a manner that the major surface of the insulating board seating the sub circuit wiring pattern is flush with the major surface of the insulating metallic board seating the main circuit wiring pattern; a major surface of the metallic plate being exposed in a bottom surface of the composite board which is on the opposite side to the major surfaces seating the main and the control circuit wiring patterns.

According to a tenth aspect of the present invention, the composite board of the ninth aspect of the present invention further comprises (c) a frame member for combining the insulating metallic board and the insulating board which are fit thereinto into one integral board.

According to an eleventh aspect of the present invention, in the composite board of the ninth aspect of the present invention, either one of the insulating metallic board and the insulating board of the composite board includes an opening to receive the other.

A twelfth aspect of the present invention is directed to a method of fabricating a semiconductor power module, comprising the steps of: (a) preparing a composite board which comprises: (i) an insulating metallic board which includes a metallic plate, a main circuit wiring pattern being disposed on one major surface of the insulating metallic board through an insulating layer; and (ii) an insulating board which includes a plate-like shaped insulating member, a sub circuit wiring pattern being disposed on one major surface of the insulating board, the insulating board being disposed adjacent to or closely parallel to the insulating metallic board in such a manner that the major surface of the insulating board seating the sub circuit wiring pattern is flush with the major surface of the insulating metallic board seating the main circuit wiring pattern; a major surface of the metallic plate being exposed in a bottom surface of the composite board which is on the opposite side to the major surfaces seating the main and the control circuit wiring patterns, (b) preparing a cylindrical case; (c) mounting a power control semiconductor element which controls an electrical power and a main terminal on the main circuit wiring pattern; (d) mounting a control element and a sub terminal on the sub circuit wiring pattern; (e) engaging one end portion of the case with a peripheral portion of the composite board which mounts the power control semiconductor element and the control element so that the case contains the power control semiconductor element and the control element inside; and (f) filling the case with a sealing resin for sealing the power control semiconductor element and the control element in such a manner that one ends of the main and the sub terminals are exposed outside the sealing resin.

Preferably, the step (c) comprises the steps of: (c-1) applying a first solder on the main circuit wiring pattern; (c-2) placing the power control semiconductor element and the main terminal on the first solder; (c-3) heating the first solder after the step (c-2); and (c-4) cooling the first solder down to a room temperature after the step (c-3).

Preferably, the step (d) comprises the steps of: (d-1) applying a second solder on the sub circuit wiring pattern; (d-2) placing the control element and the sub terminal on the second solder; (d-3) heating the second solder after the step (d-2) but concurrently with the step (c-3); and (d-4) cooling the second solder down to a room temperature after the step (d-3) but concurrently with the step (c-4).

Alternatively, the step (c) comprises the steps of: (c-5) applying a third solder on the main circuit wiring pattern; (c-6) placing a heat sink member which has an excellent electrical conductivity on the third solder; (c-7) applying a fourth solder on the heat sink member; (c-8) placing the power control semiconductor element and the main terminal on the fourth solder; (c-9) heating the third and the fourth solders after the step (c-8); and (c-10) cooling the third and the fourth solders down to a room temperature after the step (c-9).

Preferably, the step (d) comprises the steps of: (d-1) applying a fifth solder on the sub circuit wiring pattern; (d-2) placing the control element and the sub terminal on the fifth solder; (d-3) heating the fifth solder after the step (d-2) but concurrently with the step (c-9); and (d-4) cooling the fifth solder down to a room temperature after the step (d-3) but concurrently with the step (c-10).

Preferably, the step (e) comprises the step of (e-1) fixing the one end portion of the case to the peripheral portion of the composite board by an adhesive agent.

Preferably, the step (f) comprises the steps of: (f-1) filling the case with a thermosetting resin; (f-2) heating the thermosetting resin; and (f-3) cooling the thermosetting resin down to a room temperature.

In the semiconductor power module of the first aspect of the present invention, the insulating metallic board mounting the power control semiconductor element and the insulating board mounting the control element are arranged parallel to each other, and the insulating metallic board does not exist where the insulating board is disposed. Thus, a wasteful use of the expensive insulating metallic board is avoided, thereby reducing a manufacturing cost. In addition, since the insulating metallic board seating the main circuit includes the metallic plate which is exposed in the bottom of the composite board, a heat loss which is created in the main circuit is efficiently discharged outside through the metallic board.

In the semiconductor power module of the second aspect of the present invention, the insulating metallic board mounting the power control semiconductor element and the insulating board mounting the control element are arranged adjacent to or closely parallel to each other and combined with each other into one integral board by the frame member. Further, the wiring patterns on which the respective circuit elements are to be disposed are formed on the major surfaces of the same side. Hence, it is possible to treat the composite board which is comprised of the two different types of boards simply as one board and to mount the elements on the two different types of boards in the same fabrication step. This reduces the number of fabrication steps and a manufacturing cost.

In the semiconductor power module of the third aspect of the present invention, the insulating metallic board mounting the power control semiconductor element and the insulating board mounting the control element are combined with each other into one integral board by fitting one circuit board in the opening of the other circuit board. Further, the wiring patterns on which the respective circuit elements are to be disposed are formed on the major surfaces of the same side. Hence, it is possible to treat the composite board which is comprised of the two different types of boards simply as one board and to mount the elements on the two different types of boards in the same fabrication step. In addition, since no additional member such as a frame is used except for the circuit boards, the number of fabrication steps and a manufacturing cost are further reduced.

The semiconductor power module of the fourth aspect of the present invention does not comprise any structural member which extends beyond the major surface of the metallic plate which is exposed in the bottom of the composite board. Hence, when the semiconductor power module is attached to an external heat dissipation mechanism or the like which has a flat surface, no structural member will prohibit the major surface of the metallic plate from contacting the heat dissipation mechanism. As a result, an excellent thermal contact between the major surface of the metallic plate and the heat dissipation mechanism is ensured. Due to this structure, discharging of a heat loss which is created in the main circuit which is mounted on the insulating metallic board outside is particularly efficient.

In the semiconductor power module of the fifth aspect of the present invention, the major surface of the metallic plate is exposed in the bottom of the composite board to be flush with the other bottom regions of the composite board. In short, the bottom of the composite board is flat. This makes it possible to attach the semiconductor power module to an external heat dissipation mechanism in an easy manner.

In the semiconductor power module of the sixth aspect of the present invention, since the major surface mounting the main circuit wiring pattern and the major surface mounting the control circuit wiring pattern are flush with each other, mounting of the elements on the two different types of boards is performed efficiently.

In the semiconductor power module of the seventh aspect of the present invention, the insulating metallic board and the insulating board are bonded to each other into one integral board. Further, the wiring patterns on which the respective circuit elements are to be disposed are formed on the major surfaces of the same side. Hence, it is possible to treat the composite board which is comprised of the two different types of boards simply as one board and to mount the elements on the two different types of boards in the same fabrication step. In addition, since the two different types of boards are simply bonded to each other by an adhesive agent to form the composite board, the number of fabrication steps and a cost for fabricating the composite board are reduced.

In the semiconductor power module of the eighth aspect of the present invention, the insulating metallic board, the insulating board and the case are fixed to each other by an adhesion force of the sealing resin without using any linkage member which combines the insulating metallic board and the insulating board. This simplifies the structure of the semiconductor power module.

A semiconductor power module can be fabricated using the composite board of the ninth aspect of the present invention. In the composite board, the insulating metallic board mounting the power control semiconductor element and the insulating board mounting the control element are arranged parallel to each other, and the insulating metallic board does not exist where the insulating board is disposed. Thus, a wasteful use of the expensive insulating metallic board is avoided, thereby reducing a manufacturing cost. In addition, the insulating metallic board seating the main circuit includes the metallic plate which is exposed in the bottom of the composite board. Hence, in a semiconductor power module fabricated using the composite board, a heat loss which is created in the main circuit is efficiently discharged outside through the metallic board.

In the composite board of the tenth aspect of the present invention, the insulating metallic board mounting the power control semiconductor element and the insulating board mounting the control element are arranged adjacent to or closely parallel to each other and combined with each other into one integral board by the frame member. Further, the wiring patterns on which the respective circuit elements are to be disposed are formed on the major surfaces of the same side. Hence, it is possible to treat the composite board which is comprised of the two different types of boards simply as one board and to mount the elements on the two different types of boards in the same fabrication step. This reduces the number of fabrication steps and a cost for manufacturing a semiconductor power module.

In the composite board of the eleventh aspect of the present invention, the insulating metallic board mounting the power control semiconductor element and the insulating board mounting the control element are combined with each other into one integral board by fitting one circuit board in the opening of the other circuit board. Further, the wiring patterns on which the respective circuit elements are to be disposed are formed on the major surfaces of the same side. Hence, it is possible to treat the composite board which is comprised of the two different types of boards simply as one board and to mount the elements on the two different types of boards in the same fabrication step, thereby reducing the number of fabrication steps and a cost for manufacturing a semiconductor power module. In addition, since no additional member such as a frame is used except for the circuit boards, the number of fabrication steps and a cost for manufacturing a semiconductor power module are further reduced.

According to the fabrication method of the twelfth aspect of the present invention, the composite board in which the insulating metallic board and the insulating board are arranged parallel to each other and fixedly combined to each other is used to fabricate a semiconductor power module. This allows the composite board, which is comprised of the two different types of boards, to be treated simply as one circuit board and the elements to be mounted on the two different types of boards in the same fabrication step. Hence, the fabrication method includes only a reduced number of fabrication steps, which eventually reduces a manufacturing cost.

Accordingly, it is an object of the present invention to manufacture a semiconductor power module which exhibits an excellent dissipation of heat which is created in a main circuit, at a reduced cost in a reduced number of fabrication steps. It is also an object of the present invention to obtain a composite board which is used to fabricate such a semiconductor power module and to offer a method of manufacturing such a semiconductor power module.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 and 1B is a cross-sectional view of a semiconductor power module according to a first preferred embodiment of the present invention;

FIG. 1C is plan view of the semconductor power module illustrated in FIG. 1;

FIG. 5 is a front cross-sectional view of the composite board according to the first preferred embodiment;

FIG. 6 a front cross-sectional view of a composite board according to a second preferred embodiment of the present invention;

FIGS. 8 to 16 are views showing fabrication steps of the semiconductor power module of the second preferred embodiment;

FIG. 18 is a front cross-sectional view of the composite board of the third preferred embodiment;

FIG. 19 is a front cross-sectional view of a semiconductor power module according to the third preferred embodiment;

FIG. 21 is a front cross-sectional view of a semiconductor power module according to the fourth preferred embodiment;

FIG. 22 is a front cross-sectional view of a semiconductor power module according a fifth preferred embodiment of the present invention; and FIG. 23 is a front cross-sectional view of a conventional composite board.

DESCRIPTION OF THE PREFERRED EMBODIMENTS

<1. First Preferred Embodiment>

A semiconductor power module according to a first preferred embodiment of the present invention and a composite board used to fabricate the semiconductor power module will be described in the following.

<1-1. Circuit Structure and Operation of Semiconductor Power Module>

Figure 2:
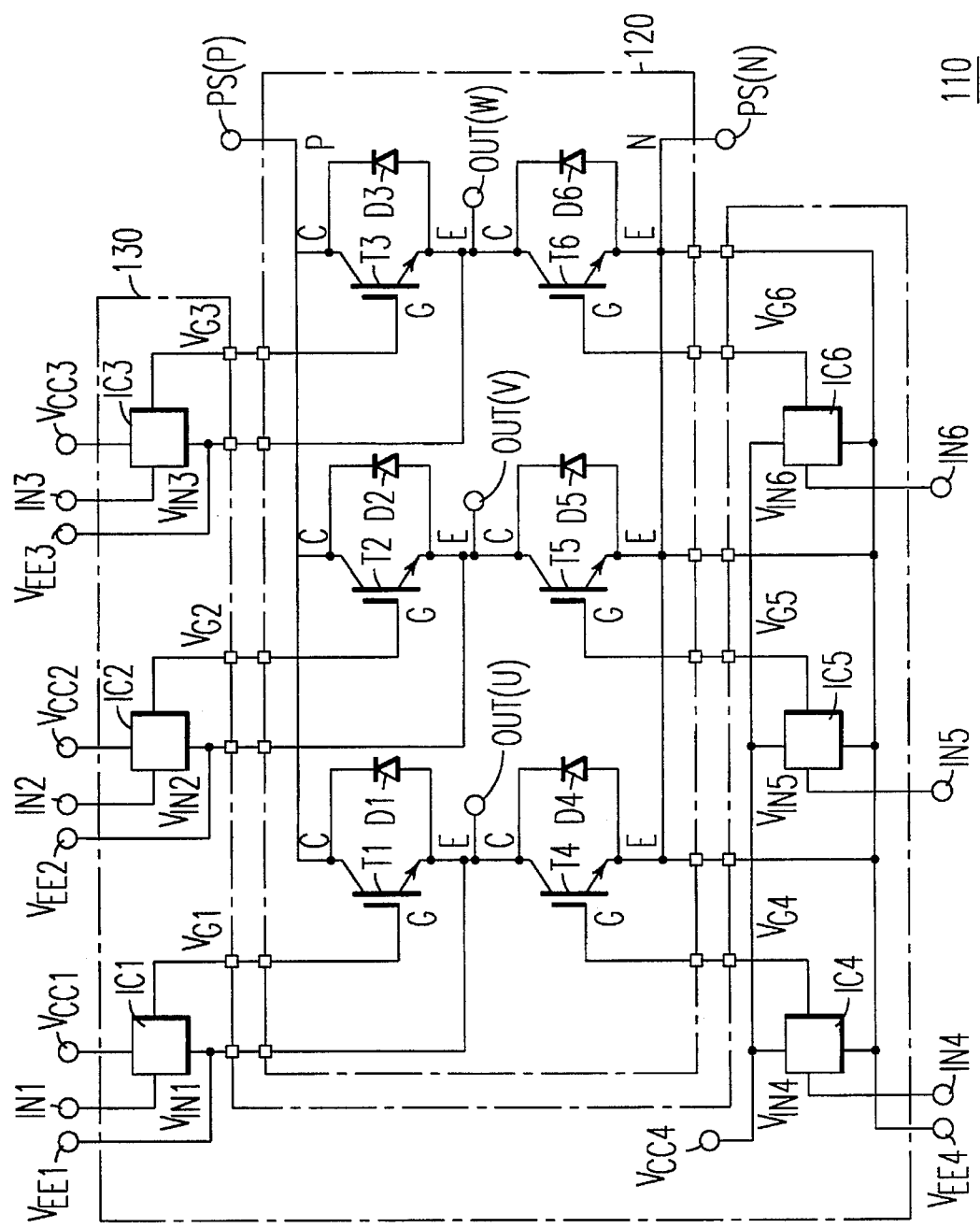
FIG. 2 diagram of the semiconductor power module according to the first preferred embodiment.

FIG. 2 is a circuitry diagram showing an essential portion of a circuit 110 of a semiconductor power module according to the first preferred embodiment of the present invention. The circuit 110 includes two circuit portions 120 and 130. The main circuit 120 is a circuit portion which controls and outputs electrical power. Two power supply terminals PS(P) and PS(N), a d/c high potential P and a d/c low potential N, respectively, are supplied from an external power source (not shown). That is, power is supplied to the main circuit 120 from the external power source through the power supply terminals PS(P) and PS(N). The main circuit 120, including six power control IGBT (Insulate Gate Bipolar Transistor) elements T1 to T6, controls the power supplied thereto in accordance with U-phase, V-phase and W-phase, and outputs the controlled power outside the semiconductor power module through three output terminals OUT(U), OUT(V) and OUT(W).

The control circuit 130 is a circuit portion which controls operations of the IGBT elements T1 to T6. The control circuit 130 includes six active semiconductor elements IC1 to IC6. In response to input signals $V_{IN}1$ to $V_{IN}6$ supplied respectively through signal input terminals IN1 to IN6 from outside, the semiconductor elements IC1 to IC6 supply gate voltage signals $V_G1$ to $V_G6$ to gates G of the IGBT elements T1 to T6. The IGBT elements T1 to T6 cut off and connect a current between its collector C and its emitter E in accordance with a relevant gate voltage signal.

High potential side power source terminals (positive power source terminals) $V_{CC}1$ to $V_{EE}4$ and low potential side power source terminals (negative power source terminals) $V_{EE}1$ to $V_{EE}4$ are disposed in the form of four high-potential/low-potential terminal pairs, and four independent external d/c voltage sources (not show) are respectively connected to the four terminal pairs so that a d/c voltage is supplied to the semiconductor elements IC1 to IC6 through these power source terminals. The negative power source terminals $V_{EE}1$ to $V_{EE}3$ are electrically connected to the emitters E of the IGBT elements T1 to T3 while the negative power source terminal $V_{EE}4$ is connected to the emitters E of the IGBT elements T4 to T6 which are at a common potential.

The main circuit 120 is to carry a main current of the semiconductor power module, and therefore, has a circuit structure which endures a large amount of current and an associated heat generation. On the other hand, the control circuit 130 being disposed to process voltage signals, is designed to carry only a very small current. No circuit structure which is suitable for a large current is necessary for the control circuit 130.

<1-2. Appearance of Semiconductor Power Module>

Figure 3:
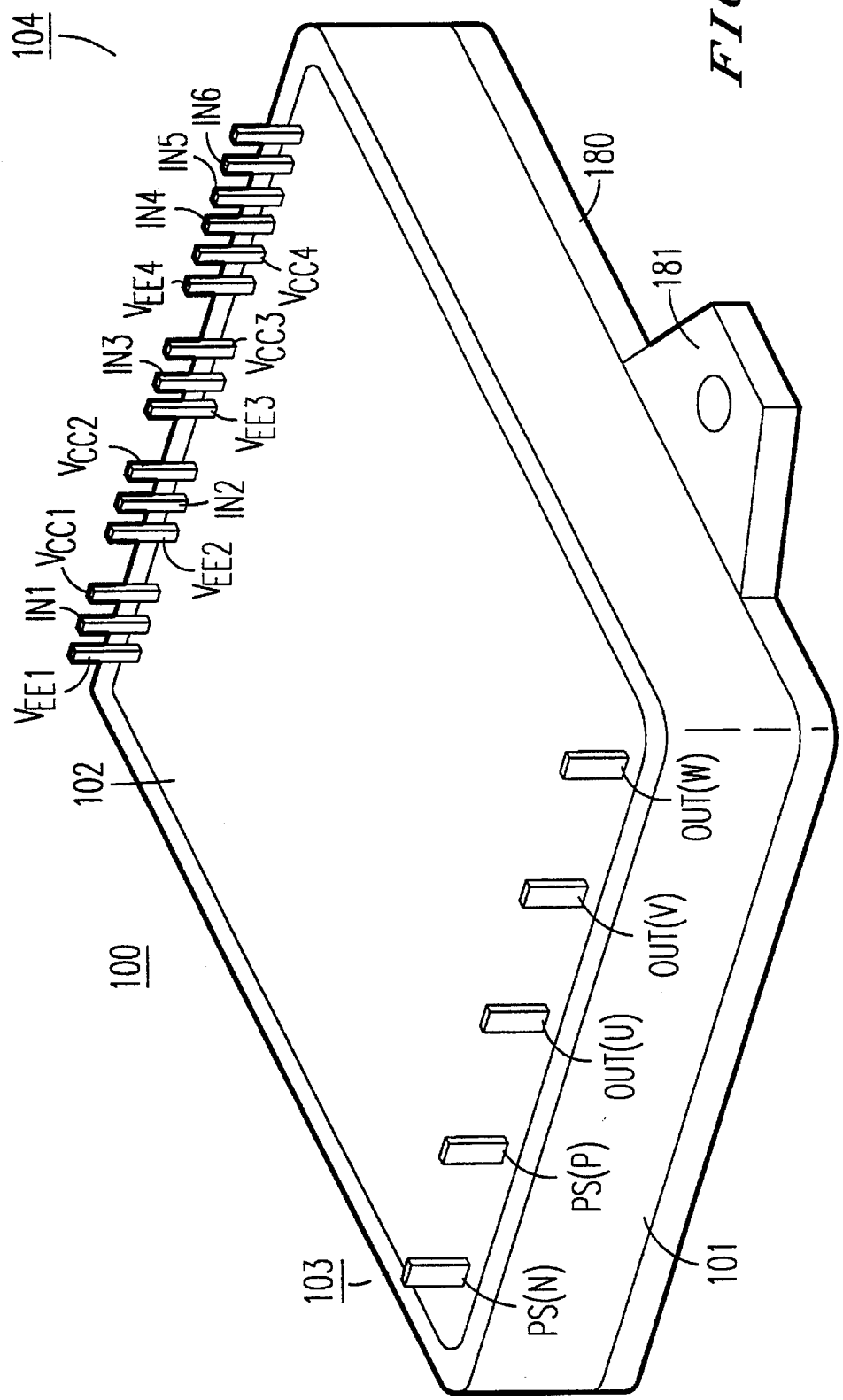
FIG. 3 is a prespective view showing an appearance of the semiconductor power module according to the first preferred embodiment.

FIG. 3 is a perspective view showing an appearance of a semiconductor power module 100. The device 100 includes a case 101 which is formed by an insulating member such as a synthetic resin. The case 101 is filled with a sealing resin 102 to seal the circuit elements. Shown in FIG. 3 is a top surface of the sealing resin 102. Terminals 103 of the main circuit 120 and terminals 104 of the control circuit 130 are exposed outside in the top surface of the sealing resin 102. A frame 180 of a composite board (described later) is attached to the bottom of the case 101. The frame 180 includes an externally protruding lug 181 which has a securing hole bored therein. By inserting a securing member such as a screw into the securing hole, the device 100 is fixedly attached to an external heat dissipation mechanism or the like (not shown).

<1-3. Composite Board>

Figure 4:
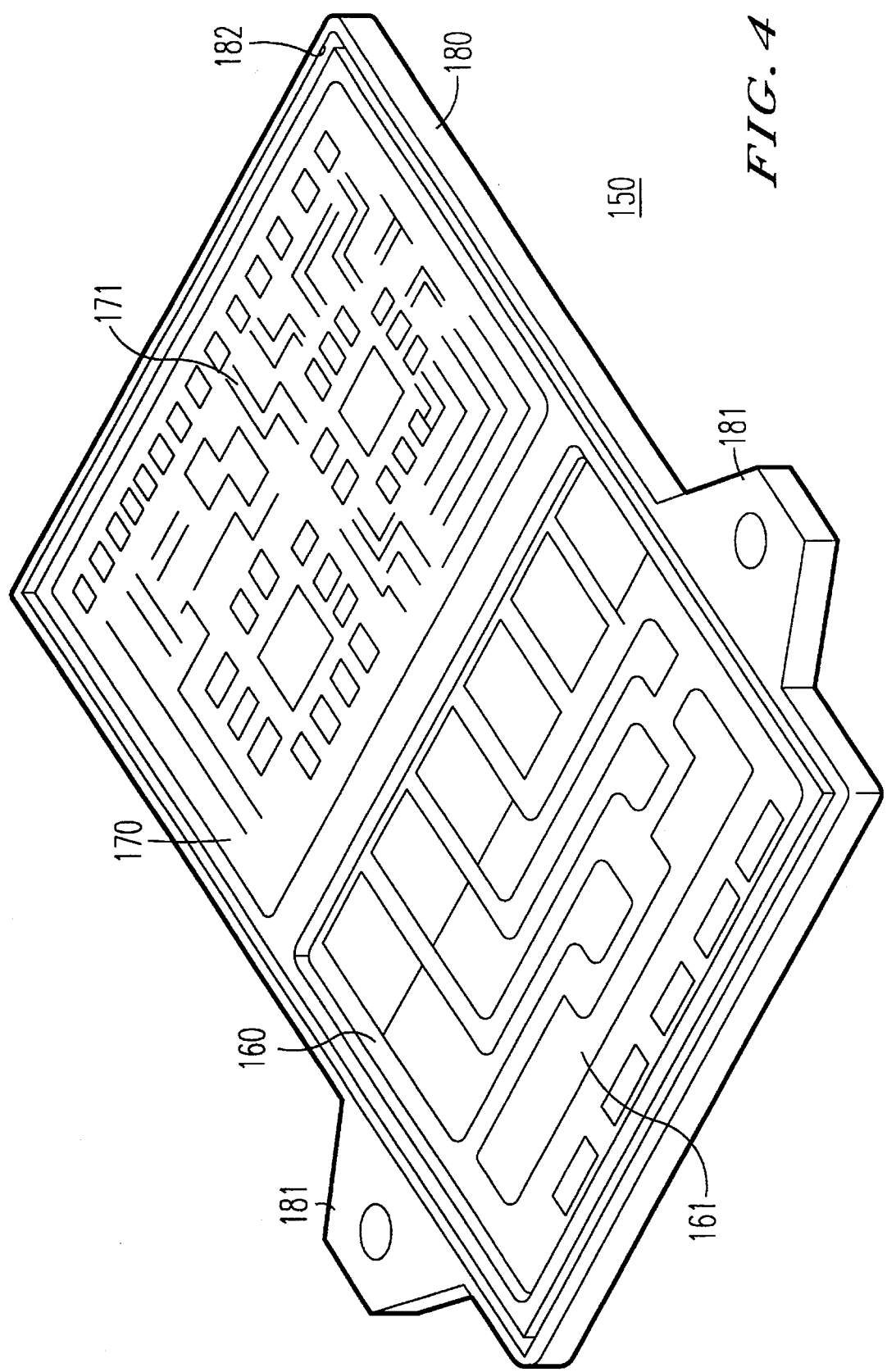
FIG. 4 is a perspective view showing an appearance of a composite board according to the first preferred embodiment.

FIG. 4 is a perspective view showing an appearance of a composite board which is used to fabricate the device 100. A composite board 150 includes an insulating metallic board 160, an insulating board 170 and the frame 180 which holds the two insulating boards as one integral board. The insulating metallic board 160 and the insulating board 170 are engaged with openings of the frame 180 so as to be arranged adjacent each other. The insulating metallic board 160 is a circuit board to mount the main circuit 120 and seats a main circuit wiring pattern 161 on its upper major surface. The insulating board 170 is a circuit board to mount the control circuit 130 and seats a control circuit wiring pattern 171 on its upper major surface. A groove 182 is formed in the top surface of the frame at the periphery. The purpose of forming the groove 182 is to make it easy to align the frame 180 with the case 101 during securing of the frame to the case 101.

FIG. 5 is a front cross-sectional view of the composite board 150. The frame 180 includes two openings which are located close to each other. One of the two openings is a through hole which includes an inward engagement protrusion at its upper end. The other opening is closed at the bottom. The insulating metallic board 160 is fit into the former opening for engagement. The opening receives the insulating metallic board 160 from below in such a manner that the upper major surface of the insulating metallic board 160 comes into tight engagement with the inward engagement protrusion of the opening. To prevent the insulating metallic board 160 from falling off from the frame 180, a side exterior surface of the insulating metallic board 160 and an inner surface of the opening which directly contact each other are bonded to each other by an adhesive agent.

The insulating board 170 is fit into the latter opening. The opening receives insulating board 170 from below in such a manner that the bottom surface of the insulating board 170 comes into tight contact with the bottom of the opening. To ensure a tight direct contact between the insulating board 170 and the opening of the frame 180, an exterior surface of the insulating board 170 and an inner surface of the opening which directly contact each other are adhered to each other by an adhesive agent. Since fabrication of the device 100 includes a heating process such as soldering, the adhesive agents are preferably heat-resistant. A silicon resin or an epoxy resin, for instance, are a good candidate for the adhesive agents. It is also preferable that the frame 180 is made of a heat-resistant material such as PPS (polyphenylene sulfide), for example.

The insulating metallic board 160 includes a metallic plate 162 which is an essential portion of the insulating metallic board 160, an insulating layer 163 which is formed on an upper surface of the metallic plate 162 and the main circuit wiring pattern 161 which is formed on an upper major surface of the insulating layer 163. Aluminum is preferable for the metallic plate 162 for its excellent heat dissipation. A lower major surface of the metallic plate 162 is exposed to the bottom of the composite board 150 so as to extend downward by a small distance beyond the bottom of the frame 180. An epoxy resin, for instance, is preferable for the insulating layer 163 for its electrical insulation and heat-resistance. The main circuit wiring pattern 161 which needs to have an excellent electrical conductivity is essentially made of copper, for example. To carry a main current of the device 100, the main circuit wiring pattern 161 is formed into dimensions which are suitable to carry a large current.

The insulating board 170 includes an insulating board body 172 and the control circuit wiring pattern 171 which is disposed on an upper major surface of the insulating board body 172. A glass fiber reinforced epoxy resin, for instance, is preferable for the insulating board body 172 for its excellent heat-resistance and large mechanical strength. A copper foil, for example, is preferable for the control circuit wiring pattern 171 for its excellent conductivity. Since the control circuit wiring pattern 171 is primarily to transfer voltage signals and does not have to carry a large current, the control circuit wiring pattern 171 does not have dimensions or a configuration which are suitable to carry a large current.

The upper major surface of the insulating metallic board 160 which seats the main circuit wiring pattern 161 and the upper major surface of the insulating board 170 which seats the control circuit wiring pattern 171 are both on the upper major surface side of the composite board 150. In short, these two upper major surfaces are facing the same direction. The insulating metallic board 160 and the insulating board 170 are disposed close to each other, and their upper major surfaces seating the wiring patterns are approximately flush with each other. Further, these two boards are combined to each other as one board by the frame 180. Hence, during fabrication of the device 100, it is possible to treat the composite board 150 which is comprised of the two different types of boards simply as one board, which in turn reduces a manufacturing cost of the device 100 as described later.

Unlike in the conventional circuit board 10 (FIG. 23) in which one board is superimposed on the other board, the insulating metallic board 160 and the insulating board 170 are arranged parallel next to each other in the frame 180. Since this eliminates a wasteful use of the expensive composite board 150, the composite board 150 is manufactured cheaper than the conventional circuit board 10.

<1-4. Cross-Sectional Structure of Semiconductor Power Module>

FIG. 1 is a front cross-sectional view of the device which is formed using the composite board 150. The peripheral top surface of the composite board 150 is attached to the bottom of the cylindrical case 101, whereby the composite board 150 and the case 101 form a housing of the device 100. More particularly, the case 101 serves as a side wall of the housing and the composite board 150 serves as the bottom of the housing. A ridge which is formed in the bottom portion of the case 101 is fit into the groove 182 (FIG. 4) which is formed on the upper surface of the frame 180 at the periphery so that the frame 180 is secured to the case 101. Thus, alignment of the frame 180 to the bottom portion of the case 101 is easy.

The insulating metallic board 160 seats the main circuit 120. That is, the IGBTs T1 to T6, fly wheel diodes D1 to D6 which are respectively connected in parallel to the IGBTs T1 to T6 to prevent destruction of the IGBTs T1 to T6, the terminals 103 and etc., are soldered to the main circuit wiring pattern 161 (FIG 1C). The IGBTs T1 to T6, which are in fact semiconductor chips, and the fly wheel diodes D1 to D6 are preferably indirectly disposed to the main circuit wiring pattern 161 through an interposing heat sink member 165 instead of being directly attached to the main circuit wiring pattern 161, as shown in FIG. 1B.

On the other hand, in the insulating board 170 which mounts the control circuit 130, the semiconductor elements IC1 to IC6, the terminals 104 and the like are connected to the control circuit wiring pattern 171 by soldering FIG. 1C. Electrical connection is made by a number of conductive wires w among the circuit elements and between the circuit elements and the wiring pattern. Aluminum is preferable for the conductive wires w for its excellent electrical conductivity. The housing of the device 100 which is formed by the case 101 and the composite board 150 is filled with the sealing resin 102 to protect the circuit elements such as the IGBTs T1 to T6 and the semiconductor elements IC1 to IC6.

The composite board 150 is located at the bottom of the device 100.- In the composite board 150, the lower major surface of the metallic plate 1.62 is exposed outside, extending a short way out of the bottom of the frame 180, as described earlier. Hence, when the device 100 is attached to an external heat dissipation mechanism or the like which has a flat surface, there is no structural member which will prohibit the lower major surface of the metallic plate 162 from contacting the heat dissipation mechanism. As a result, an excellent thermal contact between the lower major surface of the metallic plate 162 and the heat dissipation mechanism is ensured. This allows a heat loss which is developed in the IGBTs T1 to T6, the main circuit wiring pattern 161 and the like to be efficiently transferred to the metallic plate 162 which has an excellent thermal conductivity and to be thereafter efficiently discharged to the external heat dissipation mechanism which is in direct contact with the metallic plate 162.

<2. Second Preferred Embodiment>

Next, a semiconductor power module according to a second preferred embodiment of the present invention and a composite board used to fabricate the semiconductor power module will be described.

<2-1. Circuit Structure and Operation of Semiconductor Power Module>

FIG. 6 is a front cross-sectional view of a composite board 250 which is used to manufacture a semiconductor power module according to the second preferred embodiment of the present invention. The second preferred embodiment is different from the first preferred embodiment in that the lower major surface of the metallic plate 162 is registered flush with the bottom of the frame 180. Since the composite board 250 is otherwise the same as the composite board 150 of the first preferred embodiment, the other features of the composite board 250 will not be described here.

Figure 7:
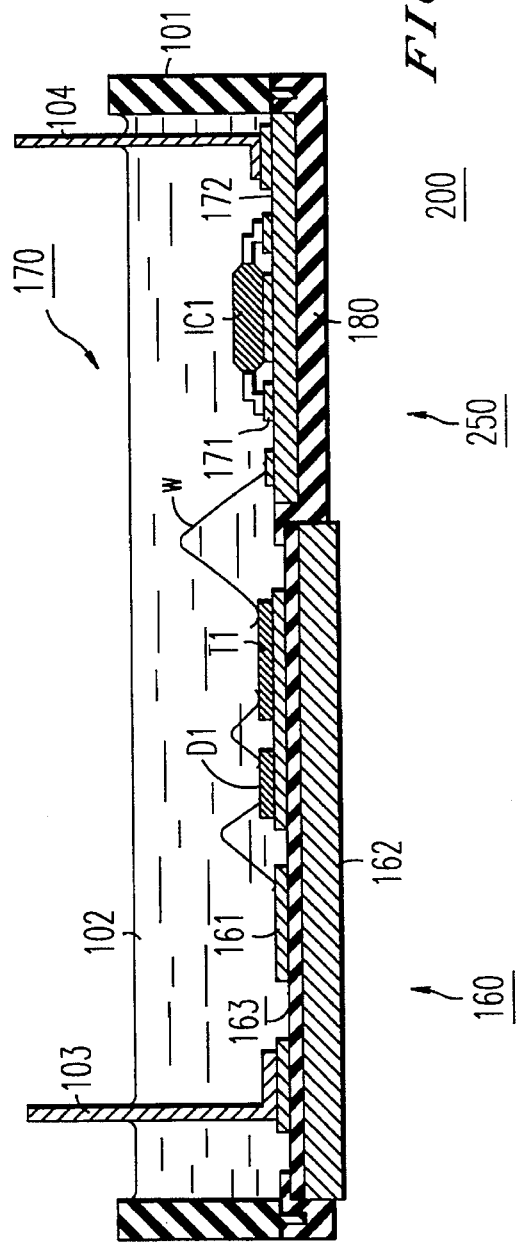
FIG. 7 is a front cross-sectional view of a semiconductor power module according to the second preferred embodiment.

FIG. 7 is a front cross-sectional view of a semiconductor power module 200 which incorporates the composite board 250. Except for the feature mentioned above which is unique to the composite board 250, the device 200 is similar in structure to the device 100 of the first preferred embodiment. As the device 100, the device 200 does not include any member which protrudes beyond the lower major surface of the metallic plate 162. Hence, when the device 200 is attached to an external heat dissipation mechanism or the like which has a flat surface, there is no structural member which will prohibit the lower major surface of the metallic plate 162 from contacting the heat dissipation mechanism. As a result, an excellent thermal contact between the lower major surface of the metallic plate 162 and the heat dissipation mechanism is ensured. In addition to this, in the device 200, since the bottom of the housing is flat all over its surface including the exposed lower major surface of the metallic plate 162, the device 200 is easily attached to the external heat dissipation mechanism which has a flat surface.

<2-2. Fabrication of Semiconductor Power Module>

Now, fabrication steps of the device 200 using the composite board 250 will be described in the following. FIGS. 8 to 16 are views of the device 200 device during successive stages in the process of fabricating.

Figure 8:
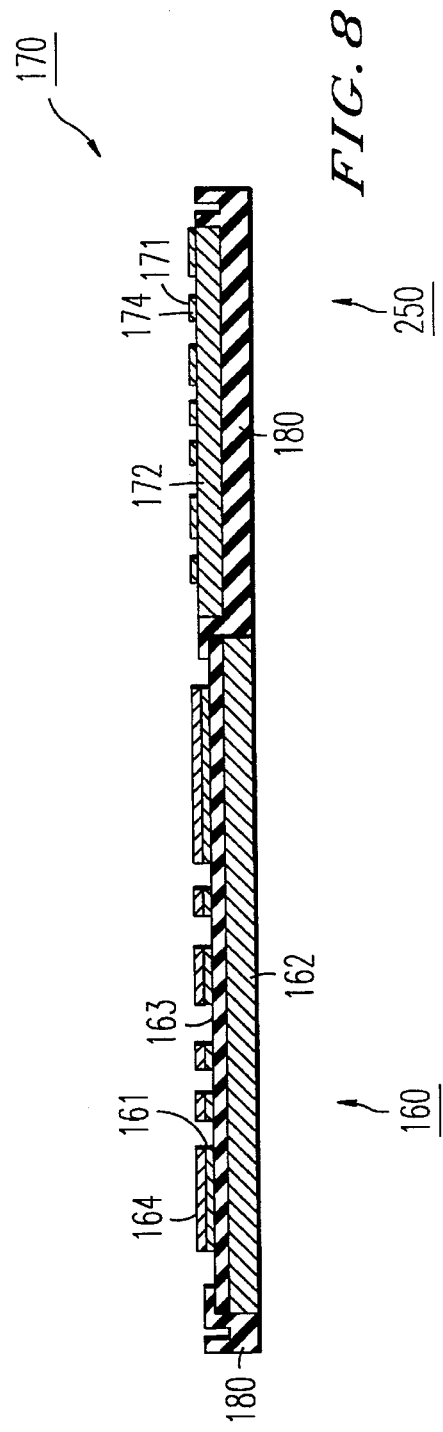

First, as shown in FIG. 8, solders 164 and 174 are printed in designated areas of the main circuit wiring pattern 161 and the control circuit wiring pattern 171 of the composite board 250 which is manufactured in advance. A heat sink member 165 and a passive circuit element ELP which is an acronym for "Passive Element in Power Circuit" of the main circuit 120 are then disposed on the solder 164 as shown in FIG. 9. On the other hand, the circuit elements of the control circuit 130, i.e., the semiconductor elements IC1 to IC6 and a passive part ELC which is an acronym for "Passive Element in control Circuit" are disposed on the solder 174.

Next, as shown in FIG. 10, a cream solder 166 is applied on the heat sink member 165. The semiconductor chips such as the IGBTs T1 to T6 and the fly wheel diodes D 1 to D6 are then disposed on the cream solder 166 as shown in FIG. 11.

The composite board 250 is then put into an ambient atmosphere furnace where it will be heated. Under heat, the solders 164 and 174 and the cream solder 166 melt. The composite board 250 is taken out from the furnace and cooled to harden the solders. The solders consequently fix the heat sink member 165, the IGBTs T1 to T6, the fly wheel diodes D1 to D6, the passive circuit element ELP, the semiconductor elements IC1 to IC6 and the passive part ELC at designated positions (FIG. 12).

After cleaning the composite board 250, electrical connection is made by the conductive wires w among the circuit elements and between the circuit elements and the wiring pattern where necessary. The terminals 103 are then soldered at designated positions in the main circuit wiring pattern 161 while the terminals 104 are soldered at designated positions in the control circuit wiring pattern 171 (FIG. 14).

The composite board 250 is once again cleaned and adhered to the bottom of the case 101 by an adhesive agent (FIG. 15). After pre-coat curing, the thermosetting sealing resin 102 is injected into the case 101 and hardened under heat. The device 200 is then cooled down to a room temperature (FIG. 16). Severing the terminals 103 and 104 in desired lengths, the device 200 as shown in FIG. 7 is completed.

According to the fabrication method heretofore described, mounting of the circuit elements and the like onto the insulating metallic board 160 and the insulating board 170 is completed in the same fabrication step. That is, the composite board 250 is treated as if it is one circuit board. As mentioned earlier, this is made possible firstly because the insulating metallic board 160 which seats the main circuit 120 and the insulating board 170 which seats the control circuit 130 are combined with each other into one integral structure, secondly because these two circuit boards are arranged close to each other, and thirdly because the circuit boards direct their major surfaces which mount the circuit elements and the like in the same direction and these major surfaces are shifted from each other by only a very small distance but almost flush with each other. Since the composite board 250 is treated simply as one board, the number of fabrication steps needed is reduced, and hence, a manufacturing cost is reduced.

<3. Third Preferred Embodiment>

Figure 17:
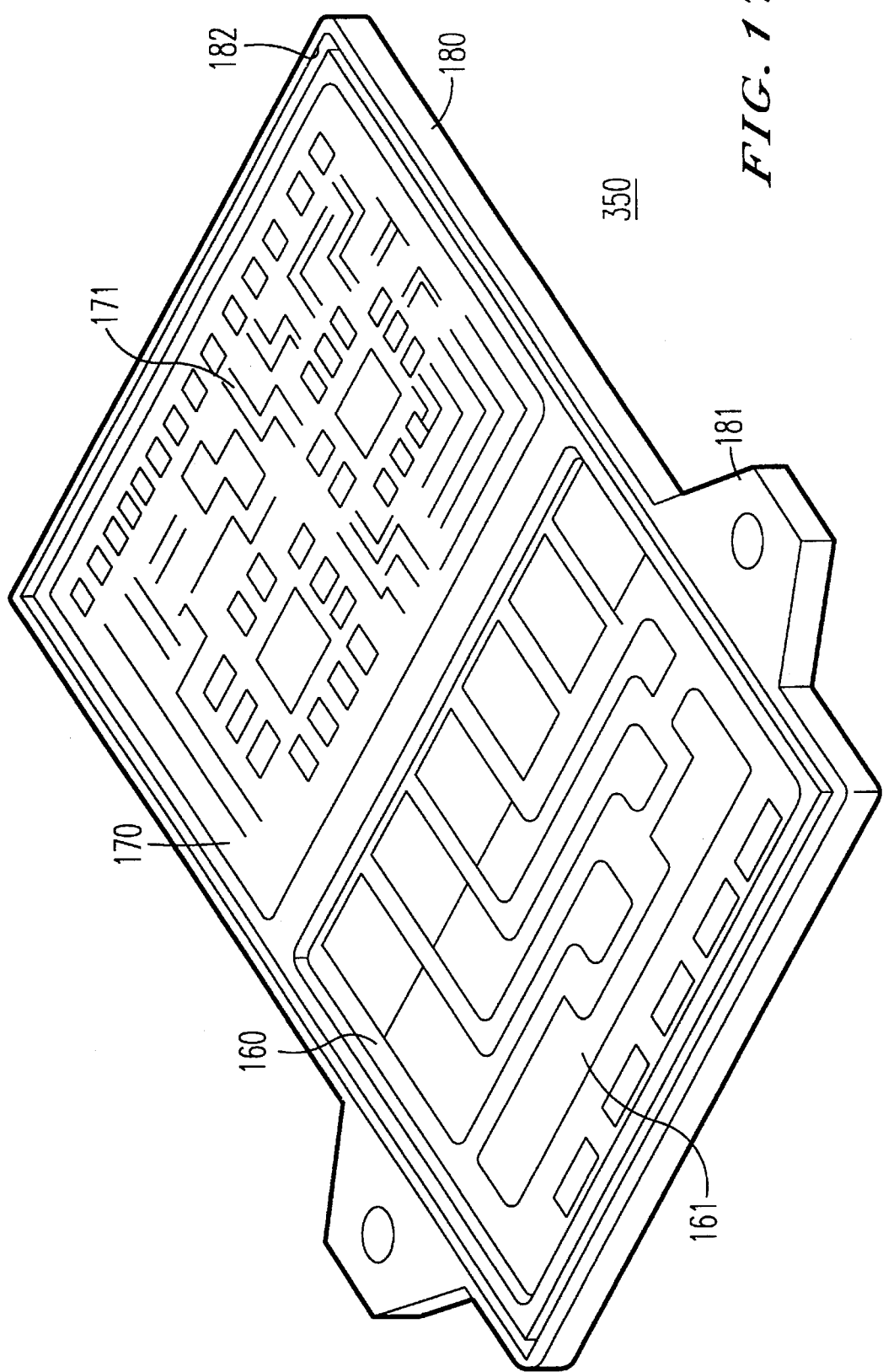
FIG. 17 is a perspective view showing an appearance of a composite board according to a thud preferred embodiment of the present invention.

Now, a semiconductor power module according to a third preferred embodiment of the present invention and a composite board used to fabricate the semiconductor power module will be described below. FIG. 17 is a perspective view showing an appearance of a composite board 350 which is used in a semiconductor power module of the third preferred embodiment of the present invention. In the third preferred embodiment, the insulating metallic board 160 and the insulating board 170 are registered with each other so that their upper major surfaces are flush with each other.

FIG. 18 is a front cross-sectional view of the composite board 350. As shown in FIG. 18, unlike in the composite board 250, the opening formed in the frame 180 for receiving the insulating metallic board 160 does not have the inward protrusion at its upper end in the composite board 350. Hence, it is possible to insert the insulating metallic board 160 deep into the opening so that the upper major surface of the insulating metallic board 160 becomes flush with the upper major surfaces of the insulating board 170 and the frame 180. Since the thickness of the insulating metallic board 160 is the same as the thickness of the frame 180, the lower major surface of the metallic plate 162 becomes flush with the bottom surface of the frame 180 as in the composite board 250.

FIG. 19 is a front cross-sectional view of the semiconductor power module 300 incorporating the composite board 350. Except for the feature mentioned above which is unique to the composite board 350, the semiconductor power module 300 is otherwise the same as the device 200 of the second preferred embodiment. The upper major surfaces of the insulating metallic board 160 and the insulating board 170 are flush with each other in the device 300, and therefore, mounting of the circuit elements and the like onto the insulating metallic board 160 and the insulating board 170 is more efficiently preformed during fabrication of the device 300 using the composite board 350. An improvement in the efficiency of fabrication processes performed by a robot or other machine is particularly noticeable.

<4. Fourth Preferred Embodiment>

Figure 20:
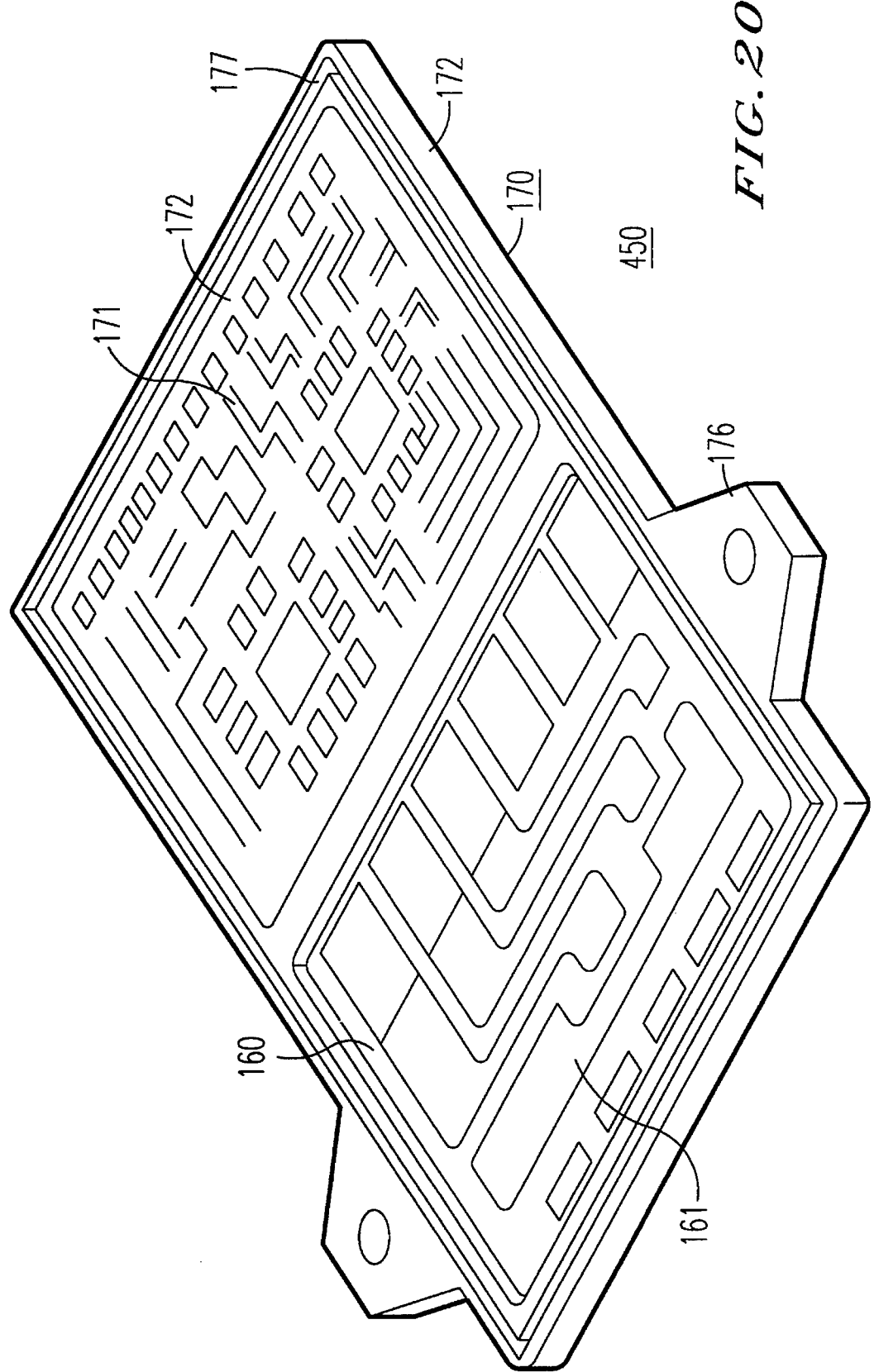
FIG 20 is a perspective view showing an appearance of a composite board according to a fourth preferred embodiment of the present invention.

Next, a semiconductor power module according to a fourth preferred embodiment of the present invention and a composite board which is used to fabricate the semiconductor power module will be described below. FIG. 20 is a perspective view showing an appearance of a composite board 450 which is used in a semiconductor power module of the fourth preferred embodiment of the present invention. The composite board 450 does not include the frame 180. The insulating board 170 performs the function of the frame 180 of the first preferred embodiment. More particularly, the insulating board body 172 of the insulating board 170 includes an opening, and the insulating metallic board 160 is inserted in this opening.

FIG. 21 is a front cross-sectional view of the semiconductor power module 400 in which the composite board 450 is incorporated. As shown in FIG. 21, the insulating board body 172 forming the composite board 450 is similar to the insulating board body 172 and the frame 180 of the composite board 150 of the first preferred embodiment as they are integrated with each other into one integral member. The device 400 is otherwise the same as the device 100 of the first preferred embodiment.

Since the insulating metallic board 160 and the insulating board 170 are combined to each other without using the frame 180 in the composite board 450, the composite board 450 is manufactured with a reduced number of components. It then follows that the device 400 incorporating the composite board 450 is manufactured in a reduced number of fabrication steps at a reduced cost.

<5. Fifth Preferred Embodiment>

A semiconductor power module according to a fifth preferred embodiment of the present invention and a composite board used to fabricate the semiconductor power module will be described below. FIG. 22 is a front cross-sectional view of a semiconductor power module 500 of the fifth preferred embodiment. Similarly to the fourth preferred embodiment, a composite board 550 of the device 500 does not include the frame 180. However, the composite board 550 is different from the composite board 450 of the fourth preferred embodiment in that an adhesive agent is used to fix the insulating metallic board 160 to the frame 180. That is, the insulating metallic board 160 and the insulating board 170 are arranged closely parallel to each other and adhered to each other at their side surfaces by an adhesive agent. The insulating metallic board 160 and the insulating board 170 have the same thickness, and bonded to each other so that their upper major surfaces are flush with each other and their lower upper major surfaces as well are flush with each other. The composite board 550 having such a structure is inserted into the case 101 from below and secured thereto by an adhesive agent. The position at which the composite board 550 is secured to the case 101 is determined so that the bottom end of the case 101 does not extend outside, i.e., downward beyond the lower major surface of the composite board 550.

In the composite board 550 of the fifth preferred embodiment, the insulating metallic board 160 and the insulating board 170 are bonded to each other simply by an adhesive agent. Hence, the number of fabrication steps needed and the manufacturing cost are further reduced.

<6. Sixth Preferred Embodiment>

The composite board 550 of the fifth preferred embodiment does not necessarily require the insulating metallic board 160 and the insulating board 170 to be adhered to each other in advance. That is, in FIG. 22, the insulating metallic board 160, the insulating board 170 and the case 101 may be fixed to each other by the sealing resin 102. In this case, since the insulating metallic board 160 and the insulating board 170 are not integrated into one member in advance, it is difficult to treat the composite board 550 as one board during fabrication of the device 500. For instance, another frame must be prepared and used as a jig during fabrication. Nevertheless, a device incorporating a composite board of the sixth preferred embodiment has the simplest structure.

While the invention has been described in detail, the foregoing description is in all aspects illustrative and not restrictive. It is understood that numerous other modifications and variations can be devised without departing from the scope of the invention.

We claim:

1. A semiconductor power module comprising:
   (a) a composite board which includes an insulating metallic board which includes a metallic plate, a main circuit wiring pattern being disposed on an insulating layer which is formed on a major surface of said insulating metallic board, said insulating layer comprising an epoxy resin; and
   an insulating board which includes an insulating member, a control circuit wiring pattern being disposed on a major surface of said insulating board, said insulating board being disposed adjacent to said insulating metallic board in such a manner that said major surface of said insulating board on which said control circuit wiring pattern is formed is flush with said major surface of said insulating metallic board on which said main circuit wiring pattern is formed,
   a major surface of said metallic plate being exposed in a bottom surface of said composite board which is opposite said major surfaces of said insulating metallic board and said insulating board seating said main and said control circuit wiring patterns, respectively;
   (b) a power control semiconductor element disposed on said main circuit wiring pattern to control electrical power, said power control semiconductor element including a plurality of insulated gate bipolar transistors;
   (c) a control element disposed on said control circuit wiring pattern to control said power control semiconductor element, said control element outputting control signals to respective gate electrodes of said insulated gate bipolar transistors;
   (d) a cylindrical case for receiving at an end thereof a peripheral portion of said composite board so as to contain said power control semiconductor element and said control element inside; and
   (e) a sealing resin injected into said case to seal said power control semiconductor element and said control element.

2. The semiconductor power module of claim 1, further including a high potential power supply terminal, a low potential power supply terminal and at least one output terminal, wherein
   said plurality of insulated gate bipolar transistors include first and second insulated gate bipolar transistors, said first insulated gate bipolar transistors being disposed between said high potential power supply terminal and said at least one output terminal, and said second insulated gate bipolar transistors being disposed between said at least one output terminal and said low potential power supply terminal.

3. The semiconductor power module of claim 2, wherein said at least one output terminal includes a plurality of output terminals,
   said first insulated gate bipolar transistors are each disposed between said high potential power supply terminal and each one of said plurality of output terminals, and
   said second insulated gate bipolar transistors are each disposed between each one of said plurality of output terminals and said low potential power supply terminal.

4. The semiconductor power module of claim 1, wherein said metallic plate comprises aluminum.

5. The semiconductor power module of claim 1, wherein said power control semiconductor element further includes fly wheel diodes which are respectively connected to said insulated gate bipolar transistors.

6. The semiconductor power module of claim 5, wherein said fly wheel diodes are connected to said main circuit wiring pattern through an electrically conductive heat sink member.

7. The semiconductor power module of claim 1, wherein one of said insulating metallic board and said insulating board of said composite board includes an opening to receive the other for engagement.

8. The semiconductor power module of claim 7, wherein said insulating board of said composite board includes said opening which extends from said major surface to an opposite major surface of said insulating board, and said insulating metallic board is fit in said opening of said insulating board.

9. The semiconductor power module of claim 1, wherein no part thereof extends beyond said major surface of said metallic plate which is exposed in said bottom surface of said composite board.

10. The semiconductor power module of claim 9, wherein said major surface of said metallic plate which is exposed in said bottom surface of said composite board and said second major surface of said frame member are flush with one another.

11. The semiconductor power module of claim 9, wherein said major surface of said metallic plate which is exposed in said bottom surface of said composite board extends beyond said second major surface of said frame member.

12. The semiconductor power module of claim 9, wherein said major surface seating said main circuit wiring pattern and said major surface seating said control circuit wiring pattern are adjusted to be flush with each other in said composite board.

13. The semiconductor power module of claim 1, wherein said insulating metallic board, said insulating board, and said cylindrical case are fixed to each other by said sealing resin.

14. A semiconductor power module comprising:
(a) a composite board which includes
an insulating metallic board which includes a metallic plate, a main circuit wiring pattern being disposed on an insulating layer which is formed on a major surface of said insulating metallic board; and
an insulating board which includes an insulating member, a control circuit wiring pattern being disposed on a major surface of said insulating board, said insulating board being disposed adjacent to said insulating metallic board in such a manner that said major surface of said insulating board on which said control circuit wiring pattern is formed is flush with said major surface of said insulating metallic board on which said main circuit wiring pattern is formed, said insulating member comprising a fiber reinforced epoxy resin,
a major surface of said metallic plate being exposed in a bottom surface of said composite board which is opposite said major surfaces of said insulating metallic board and said insulating board seating said main and said control circuit wiring patterns, respectively;
(b) a power control semiconductor element disposed on said main circuit wiring pattern to control electrical power, said power control semiconductor element including a plurality of insulated gate bipolar transistors;
(c) a control element disposed on said control circuit wiring pattern to control said power control semiconductor element, said control element outputting control signals to respective gate electrodes of said insulated gate bipolar transistors;
(d) a cylindrical case for receiving at an end thereof a peripheral portion of said composite board so as to contain said power control semiconductor element and said control element inside; and
(e) a sealing resin injected into said case to seal said power control semiconductor element and said control element.

15. The semiconductor power module of claim 14, further including a high potential power supply terminal, a low potential power supply terminal and at least one output terminal, wherein said plurality of insulated gate bipolar transistors include first and second insulated gate bipolar transistors, said first insulated gate bipolar transistors being disposed between said high potential power supply terminal and said at least one output terminal, and said second insulated gate bipolar transistors being disposed between said at least one output terminal and said low potential power supply terminal.

16. The semiconductor power module of claim 15, wherein said at least one output terminal includes a plurality of output terminals,
said first insulated gate bipolar transistors are each disposed between said high potential power supply terminal and each one of said plurality of output terminals, and
said second insulated gate bipolar transistors are each disposed between each one of said plurality of output terminals and said low potential power supply terminal.

17. The semiconductor power module of claim 14, wherein said metallic plate comprises aluminum.

18. The semiconductor power module of claim 14, wherein said power control semiconductor element further includes fly wheel diodes which are respectively connected to said insulated gate bipolar transistors.

19. The semiconductor power module of claim 18, wherein said fly wheel diodes are connected to said main circuit wiring pattern through an electrically conductive heat sink member.

20. The semiconductor power module of claim 14, wherein one of said insulating metallic board and said insulating board of said composite board includes an opening to receive the other for engagement.

21. The semiconductor power module of claim 20, wherein said insulating board of said composite board includes said opening which extends from said major surface to an opposite major surface of said insulating board, and said insulating metallic board is fit in said opening of said insulating board.

22. The semiconductor power module of claim 14, wherein no part thereof extends beyond said major surface of said metallic plate which is exposed in said bottom surface of said composite board.

23. The semiconductor power module of claim 22, wherein said major surface of said metallic plate which is exposed in said bottom surface of said composite board and said second major surface of said frame member are flush with one another.

24. The semiconductor power module of claim 22, wherein said major surface of said metallic plate which is exposed in said bottom surface of said composite board extends beyond said second major surface of said frame member.

25. The semiconductor power module of claim 22, wherein said major surface seating said main circuit wiring pattern and said major surface seating said control circuit wiring pattern are adjusted to be flush with each other in said composite board.

26. The semiconductor power module of claim 14, wherein said insulating metallic board, said insulating board, and said cylindrical case are fixed to each other by said sealing resin.

27. A semiconductor power module comprising:
(a) a composite board which includes an insulating metallic board which includes a metallic plate, a main circuit wiring pattern being disposed on an insulating layer which is formed on a major surface of said insulating metallic board; and an insulating board which includes an insulating member, a control circuit wiring pattern being disposed on a major surface of said insulating board, said insulating board being disposed adjacent to said insulating metallic board in such a manner that said major surface of said insulating board on which said control circuit wiring pattern is formed is flush with said major surface of said insulating metallic board on which said main circuit wiring pattern is formed, a major surface of said metallic plate being exposed in a bottom surface of said composite board which is opposite said major surfaces of said insulating metallic board and said insulating board seating said main and said control circuit wiring patterns, respectively;

(b) a power control semiconductor element disposed on said main circuit wiring pattern to control electrical power, said power control semiconductor element including a plurality of insulated gate bipolar transistors;

(c) a control element disposed on said control circuit wiring pattern to control said power control semiconductor element, said control element outputting control signals to respective gate electrodes of said insulated gate bipolar transistors;

(d) a cylindrical case for receiving at an end thereof a peripheral portion of said composite board so as to contain said power control semiconductor element and said control element inside;

(e) a sealing resin injected into said case to seal said power control semiconductor element and said control element; and (f) an electrically conductive heat sink member disposed between said first and second insulated gate bipolar transistors and said main circuit wiring pattern.

28. The semiconductor power module of claim 27, further including a high potential power supply terminal, a low potential power supply terminal and at least one output terminal, wherein said plurality of insulated gate bipolar transistors include first and second insulated gate bipolar transistors, said first insulated gate bipolar transistors being disposed between said high potential power supply terminal and said at least one output terminal, and said second insulated gate bipolar transistors being disposed between said at least one output terminal and said low potential power supply terminal.

29. The semiconductor power module of claim 28, wherein said at least one output terminal includes a plurality of output terminals, said first insulated gate bipolar transistors are each disposed between said high potential power supply terminal and each one of said plurality of output terminals, and said second insulated gate bipolar transistors are each disposed between each one of said plurality of output terminals and said low potential power supply terminal.

30. The semiconductor power module of claim 27, wherein said metallic plate comprises aluminum.

31. The semiconductor power module of claim 27, wherein said power control semiconductor element further includes fly wheel diodes which are respectively connected to said insulated gate bipolar transistors.

32. The semiconductor power module of claim 31, wherein said fly wheel diodes are connected to said main circuit wiring pattern through an electrically conductive heat sink member.

33. The semiconductor power module of claim 27, wherein one of said insulating metallic board and said insulating board of said composite board includes an opening to receive the other for engagement.

34. The semiconductor power module of claim 33, wherein said insulating board of said composite board includes said opening which extends from said major surface to an opposite major surface of said insulating board, and said insulating metallic board is fit in said opening of said insulating board.

35. The semiconductor power module of claim 27, wherein no part thereof extends beyond said major surface of said metallic plate which is exposed in said bottom surface of said composite board.

36. The semiconductor power module of claim 35, wherein said major surface of said metallic plate which is exposed in said bottom surface of said composite board and said second major surface of said frame member are flush with one another.

37. The semiconductor power module of claim 35, wherein said major surface of said metallic plate which is exposed in said bottom surface of said composite board extends beyond said second major surface of said frame member.

38. The semiconductor power module of claim 35, wherein said major surface seating said main circuit wiring pattern and said major surface seating said control circuit wiring pattern are adjusted to be flush with each other in said composite board.

39. The semiconductor power module of claim 27, wherein said insulating metallic board, said insulating board, and said cylindrical case are fixed to each other by said sealing resin.

40. A semiconductor power module comprising:

(a) a composite board which includes an insulating metallic board which includes a metallic plate, a main circuit wiring pattern being disposed on an insulating layer which is formed on a major surface of said insulating metallic board;

an insulating board which includes an insulating member, a control circuit wiring pattern being disposed on a major surface of said insulating board, said insulating board being disposed adjacent to said insulating metallic board in such a manner that said major surface of said insulating board on which said control circuit wiring pattern is formed is flush with said major surface of said insulating metallic board on which said main circuit wiring pattern is formed, a major surface of said metallic plate being exposed in a bottom surface of said composite board which is opposite said major surfaces of said insulating metallic board and said insulating board seating said main and said control circuit wiring patterns, respectively; and a frame member for combining said insulating metallic board and said insulating board into one integral board;

(b) a power control semiconductor element disposed on said main circuit wiring pattern to control electrical power;

(c) a control element disposed on said control circuit wiring pattern to control said power control semiconductor element;

(d) a cylindrical case for receiving at an end thereof a peripheral portion of said composite board so as to contain said power control semiconductor element and said control element inside; and (e) a sealing resin injected into said case to seal said power control semiconductor element and said control element.

41. The semiconductor power module of claim 40, wherein said frame member has first and second major surfaces, and first and second openings, said first opening penetrating said frame member from said first major surface to said second major surface of said frame member, said second opening being open on said first major surface but closed on said second major surface of said frame member, said insulating metallic board being fit into said first opening in such a manner that said main circuit wiring pattern is on a first major surface side, and said insulating board being fit into said second opening in such a manner that said control circuit wiring pattern is on said first major surface side.

42. The semiconductor power module according to claim 41, wherein said frame member has an extending protrusion which has a through hole.

43. The semiconductor power module according to claim 41, wherein a ridge is formed along a periphery of said cylindrical case and said end thereof, and a groove is formed along a periphery of said frame member for engagement with said ridge.

44. The semiconductor power module of claim 41, wherein said insulating metallic board and said insulating board are both fixed to said frame member by an adhesive agent.

45. The semiconductor power module of claim 44, wherein said adhesive agent comprises a heat-resistant resin.

46. The semiconductor power module of claim 45, wherein said resin is polyphenylene sulfide.

47. The semiconductor power module of claim 41, wherein said first opening includes an extending protrusion at an end of said first opening so as to prevent said insulating metallic board which is inserted into said first opening from sliding toward said first major surface side from its inserted position.

48. A semiconductor power module comprising:
(a) a composite board which includes an insulating metallic board which includes a metallic plate, a main circuit wiring pattern being disposed on an insulating layer which is formed on a major surface of said insulating metallic board; and an insulating board which includes an insulating member, a control circuit wiring pattern being disposed on a major surface of said insulating board, and an extending protrusion which has a through hole, said insulating board being disposed adjacent to said insulating metallic board in such a manner that said major surface of said insulating board on which said control circuit wiring pattern is formed is flush with said major surface of said insulating metallic board on which said main circuit wiring pattern is formed, a major surface of said metallic plate being exposed in a bottom surface of said composite board which is opposite said major surfaces of said insulating metallic board and said insulating board seating said main and said control circuit wiring patterns, respectively, said insulating board of said composite board including an opening to receive said insulating metallic board for engagement, said opening extending from said major surface to an opposite major surface of said insulating board;

(b) a power control semiconductor element disposed on said main circuit wiring pattern to control electrical power;

(c) a control element disposed on said control circuit wiring pattern to control said power control semiconductor element;

(d) a cylindrical case for receiving at an end thereof a peripheral portion of said composite board so as to contain said power control semiconductor element and said control element inside; and (e) a sealing resin injected into said case to seal said power control semiconductor element and said control element.

49. A semiconductor power module comprising:
(a) a composite board which includes an insulating metallic board which includes a metallic plate, a main circuit wiring pattern being disposed on an insulating layer which is formed on a major surface of said insulating metallic board;

an insulating board which includes an insulating member, a control circuit wiring pattern being disposed on a major surface of said insulating board, said insulating board being disposed adjacent to said insulating metallic board in such a manner that said major surface of said insulating board on which said control circuit wiring pattern is formed is flush with said major surface of said insulating metallic board on which said main circuit wiring pattern is formed, a major surface of said metallic plate being exposed in a bottom surface of said composite board which is opposite said major surfaces of said insulating metallic board and said insulating board seating said main and said control circuit wiring patterns, respectively, said insulating board of said composite board including an opening to receive said insulating metallic board for engagement, said opening extending from said major surface to an opposite major surface of said insulating board; and a frame member for combining said insulating metallic board and said insulating board into one integral board, a groove being formed along a periphery of said frame member;

(b) a power control semiconductor element disposed on said main circuit wiring pattern to control electrical power;

(c) a control element disposed on said control circuit wiring pattern to control said power control semiconductor element;

(d) a cylindrical case for receiving at an end thereof a peripheral portion of said composite board so as to contain said power control semiconductor element and said control element inside, a ridge being formed along a periphery of said cylindrical case at said end thereof for engagement with said groove of said frame member; and (e) a sealing resin injected into said case to seal said power control semiconductor element and said control element.

50. A semiconductor power module comprising:
(a) a composite board which includes an insulating metallic board which includes a metallic plate, a main circuit wiring pattern being disposed on an insulating layer which is formed on a major surface of said insulating metallic board; and an insulating board which includes an insulating member, a control circuit wiring pattern being disposed on a major surface of said insulating board, said insulating board being disposed adjacent to said insulating metallic board in such a manner that said major surface of said insulating board on which said control circuit wiring pattern is formed is flush with said major surface of said insulating metallic board on which said main circuit wiring pattern is formed, a major surface of said metallic plate being exposed in a bottom surface of said composite board which is opposite said major surfaces of said insulating metallic board and said insulating board seating said main and said control circuit wiring patterns, respectively, said insulating board of said composite board including an opening to receive said insulating metallic board for engagement, said opening extending from said major surface to an opposite major surface of said insulating board, said opening including an extending protrusion at an end thereof so as to prevent said insulating metallic board from sliding toward said main circuit wiring pattern from its inserted position;

(b) a power control semiconductor element disposed on said main circuit wiring pattern to control electrical power;

(c) a control element disposed on said control circuit wiring pattern to control said power control semiconductor element;

(d) a cylindrical case for receiving at an end thereof a peripheral portion of said composite board so as to contain said power control semiconductor element and said control element inside; and (e) a sealing resin injected into said case to seal said power control semiconductor element and said control element.

51. A semiconductor power module comprising:

(a) a composite board which includes an insulating metallic board which includes a metallic plate, a main circuit wiring pattern being disposed on an insulating layer which is formed on a major surface of said insulating metallic board; and an insulating board which includes an insulating member, a control circuit wiring pattern being disposed on a major surface of said insulating board, said insulating board being disposed adjacent to said insulating metallic board in such a manner that said major surface of said insulating board on which said control circuit wiring pattern is formed is flush with said major surface of said insulating metallic board on which said main circuit wiring pattern is formed, a major surface of said metallic plate being exposed in a bottom surface of said composite board which is opposite said major surfaces of said insulating metallic board and said insulating board seating said main and said control circuit wiring patterns, respectively, said insulating metallic board and said insulating board of said composite board being disposed adjacent to each other and bonded to each other by an adhesive agent;

(b) a power control semiconductor element disposed on said main circuit wiring pattern to control electrical power;

(c) a control element disposed on said control circuit wiring pattern to control said power control semiconductor element;

(d) a cylindrical case for receiving at an end thereof a peripheral portion of said composite board so as to contain said power control semiconductor element and said control element inside; and (e) a sealing resin injected into said case to seal said power control semiconductor element and said control element.

52. A method of fabricating a semiconductor power module, comprising the steps of:

(a) preparing a composite board which comprises:
  (i) an insulating metallic board which includes a metallic plate, a main circuit wiring pattern being disposed on an insulating layer which is formed on a major surface of said insulating metallic board through an insulating layer; and
  (ii) an insulating board which includes an insulating member, a sub circuit wiring pattern being disposed on a major surface of said insulating board, said insulating board being disposed adjacent to said insulating metallic board in such a manner that said major surface of said insulating board on which said sub circuit wiring pattern is formed is flush with said major surface of said insulating metallic board on which said main circuit wiring pattern is formed;

a major surface of said metallic plate being exposed in a bottom surface of said composite board which is opposite said major surfaces of said insulating metallic board and said insulating board seating said main and said control circuit wiring patterns, respectively;

(b) preparing a cylindrical case;

(c) mounting a power control semiconductor element which controls electrical power and mounting a main terminal on said main circuit wiring pattern, said step (c) including the steps of:
  (c-1) applying a first solder on said main circuit wiring pattern;
  (c-2) placing said power control semiconductor element and said main terminal on said first solder;
  (c-3) heating said first solder after said step (c-2);
  (c-4) cooling said first solder down to room temperature after said step (c-3);
  (c-5) applying a third solder on said main circuit wiring pattern;
  (c-6) placing an electrically conductive heat sink member on said third solder;
  (c-7) applying a fourth solder on said heat sink member;
  (c-8) placing said power control semiconductor element and said main terminal on said fourth solder;
  (c-9) heating said third and said fourth solders after said step (c-8); and
  (c-10) cooling said third and said fourth solders down to room temperature after said step (c-9);

(d) mounting a control element and a sub terminal on said sub circuit wiring pattern;

(e) engaging an end portion of said cylindrical case with a peripheral portion of said composite board which mounts said power control semiconductor element and said control element so that said cylindrical case contains said power control semiconductor element and said control element therein; and (f) filling said cylindrical case with a sealing resin for sealing said power control semiconductor element and said control element in such a manner that an end of each of said main terminal and said sub terminal is exposed outside said sealing resin.

53. The method of claim 52, wherein said step (d) comprises the steps of:
  (d-1) applying a second solder on said sub circuit wiring pattern;
  (d-2) placing said control element and said sub terminal on said second solder;
  (d-3) heating said second solder after said step (d-2) but concurrently with said step (c-3); and (d-4) cooling said second solder down to room temperature after said step (d-3) but concurrently with said step (c-4).

54. The method of claim 52, wherein said step (d) comprises the steps of:

(d-1) applying a fifth solder on said sub circuit wiring pattern;

(d-2) placing said control element and said sub terminal on said fifth solder;

(d-3) heating said fifth solder after said step (d-2) but concurrently with said step (c-9); and (d-4) cooling said fifth solder down to room temperature after said step (d-3) but concurrently with said step (c-10).

55. The method of claim 52, wherein said step (e) comprises the step of fixing said one end portion of said cylindrical case to said peripheral portion of said composite board by an adhesive agent.

56. The method of claim 52, wherein said step (f) comprises the steps of:

(f-1) filling said case with a thermosetting resin;

(f-2) heating said thermosetting resin; and (f-3) cooling said thermosetting resin down to room temperature.

* * * * *